United States Patent
Ota et al.

(10) Patent No.: US 8,642,418 B2
(45) Date of Patent: Feb. 4, 2014

(54) METHOD OF MANUFACTURING SEMICONDUCTOR DEVICE WITH OFFSET SIDEWALL STRUCTURE

(71) Applicant: Renesas Electronics Corporation, Kodaira (JP)

(72) Inventors: Kazunobu Ota, Tokyo (JP); Hirokazu Sayama, Tokyo (JP); Hidekazu Oda, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 13/964,849

(22) Filed: Aug. 12, 2013

(65) Prior Publication Data

US 2013/0330890 A1    Dec. 12, 2013

Related U.S. Application Data

(63) Continuation of application No. 13/833,891, filed on Mar. 15, 2013, now Pat. No. 8,541,272, which is a continuation of application No. 13/185,624, filed on Jul. 19, 2011, now Pat. No. 8,415,213, which is a continuation of application No. 12/484,618, filed on Jun. 15, 2009, now Pat. No. 7,998,802, which is a continuation of application No. 11/743,021, filed on May 1, 2007, now Pat. No. 7,563,663, which is a continuation of application No. 10/212,252, filed on Aug. 6, 2002, now Pat. No. 7,220,637.

(30) Foreign Application Priority Data

Sep. 21, 2001   (JP) ................................. 2001-288918

(51) Int. Cl.
*H01L 21/8238* (2006.01)

(52) U.S. Cl.
USPC ........... 438/199; 438/217; 438/229; 438/231; 438/232

(58) Field of Classification Search
USPC .................. 438/199, 217, 229, 230, 231, 232
See application file for complete search history.

(56) References Cited

U.S. PATENT DOCUMENTS

| 5,405,791 A | 4/1995 | Ahmad et al. |
| 6,217,357 B1 | 4/2001 | Masuoka |

(Continued)

FOREIGN PATENT DOCUMENTS

| JP | 64-84659 | 3/1989 |
| JP | 3-58430 | 3/1991 |

(Continued)

OTHER PUBLICATIONS

H. Sayama, et al. "80nm CMOSFET Technology Using Double Offset-Implanted Source/Drain Extension and Low Temperature SIN Process" IEEE 2000, 4 pages.

(Continued)

*Primary Examiner* — Thanh V Pham
(74) *Attorney, Agent, or Firm* — Oblon, Spivak, McClelland, Maier & Neustadt, L.L.P.

(57) ABSTRACT

A method of manufacturing a semiconductor device with NMOS and PMOS transistors is provided. The semiconductor device can lessen a short channel effect, can reduce gate-drain current leakage, and can reduce parasitic capacitance due to gate overlaps, thereby inhibiting a reduction in the operating speed of circuits. An N-type impurity such as arsenic is ion implanted to a relatively low concentration in the surface of a silicon substrate (1) in a low-voltage NMOS region (LNR) thereby to form extension layers (61). Then, a silicon oxide film (OX2) is formed to cover the whole surface of the silicon substrate (1). The silicon oxide film (OX2) on the side surfaces of gate electrodes (51-54) is used as an offset sidewall. Then, boron is ion implanted to a relatively low concentration in the surface of the silicon substrate (1) in a low-voltage PMOS region (LPR) thereby to form P-type impurity layers (621) later to be extension layers (62).

8 Claims, 23 Drawing Sheets

(56) References Cited

U.S. PATENT DOCUMENTS

| | | | |
|---|---|---|---|
| 6,380,021 | B1 | 4/2002 | Wang et al. |
| 6,492,218 | B1 | 12/2002 | Mineji |
| 6,569,742 | B1 | 5/2003 | Taniguchi et al. |
| 6,614,684 | B1 | 9/2003 | Shukuri et al. |
| 7,531,402 | B2 | 5/2009 | Ota et al. |
| 2001/0019641 | A1 | 9/2001 | Ikeda et al. |
| 2002/0006054 | A1 | 1/2002 | Shukuri et al. |
| 2002/0163080 | A1 | 11/2002 | Taniguchi et al. |
| 2010/0190354 | A1 | 7/2010 | Burnett et al. |

FOREIGN PATENT DOCUMENTS

| | | |
|---|---|---|
| JP | 6-216151 | 8/1994 |
| JP | 6-268165 | 9/1994 |
| JP | 9-167804 | 6/1997 |
| JP | 9-172176 | 6/1997 |
| JP | 2000-269357 | 9/2000 |
| JP | 2001-110913 | 4/2001 |

OTHER PUBLICATIONS

Japanese Office Action issued Jan. 25, 2011 in Patent Application No. 2001-288918 (with partial English-language translation).

Office Action issued Jan. 15, 2013 in Japanese Application No. 2011-060369 (w/partial English language translation).

Office Action mailed Apr. 23, 2013 in Japanese Application No. 2011-060369 (w/partial English translation).

F I G. 1
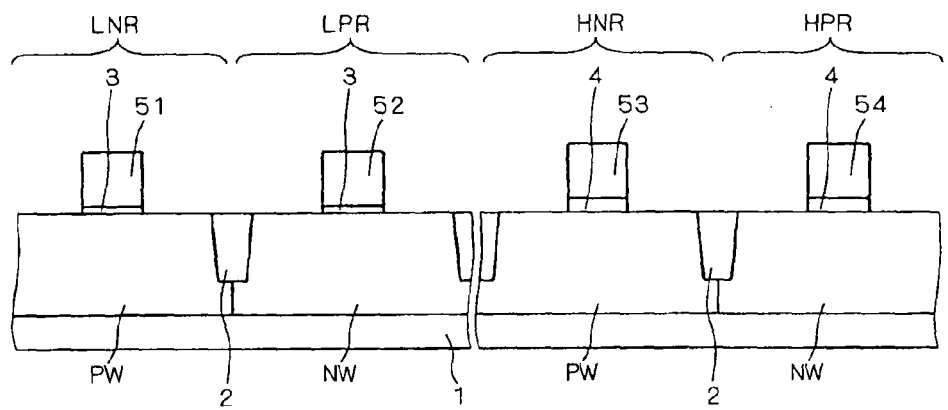
F I G. 2
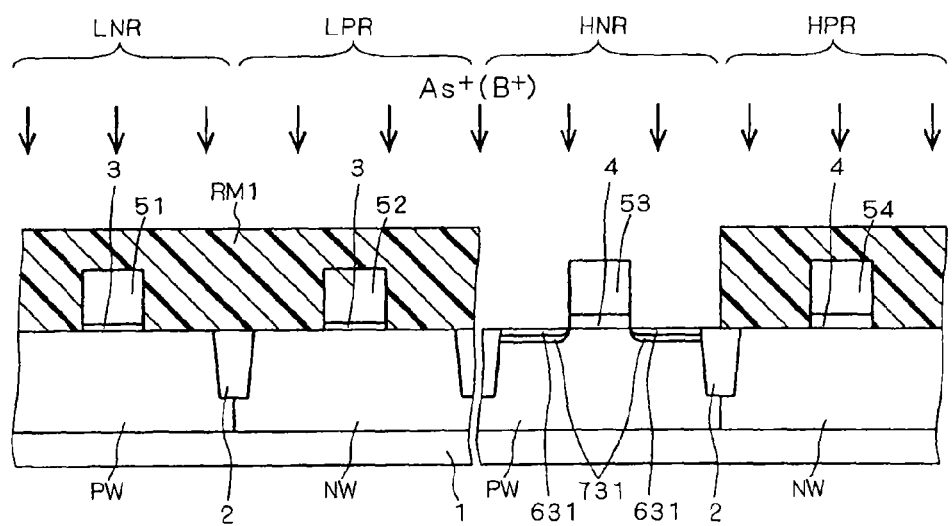

F I G. 17
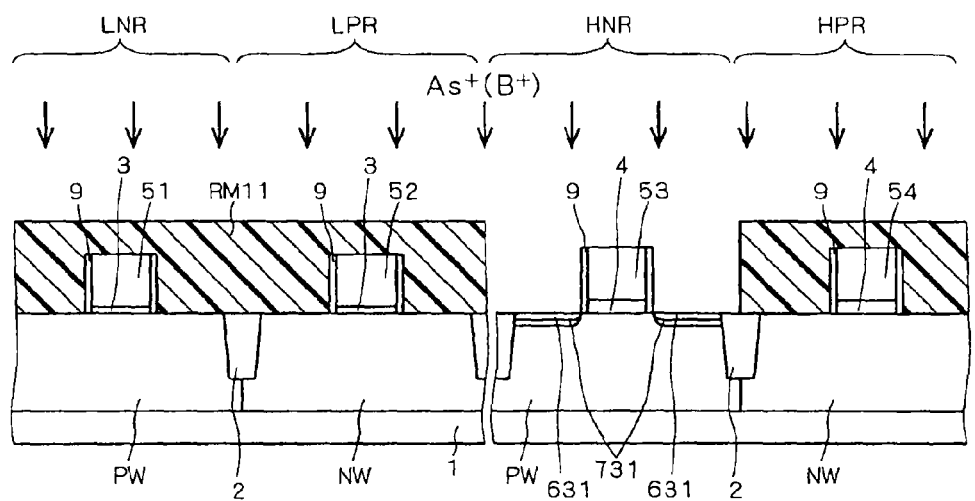
F I G. 18
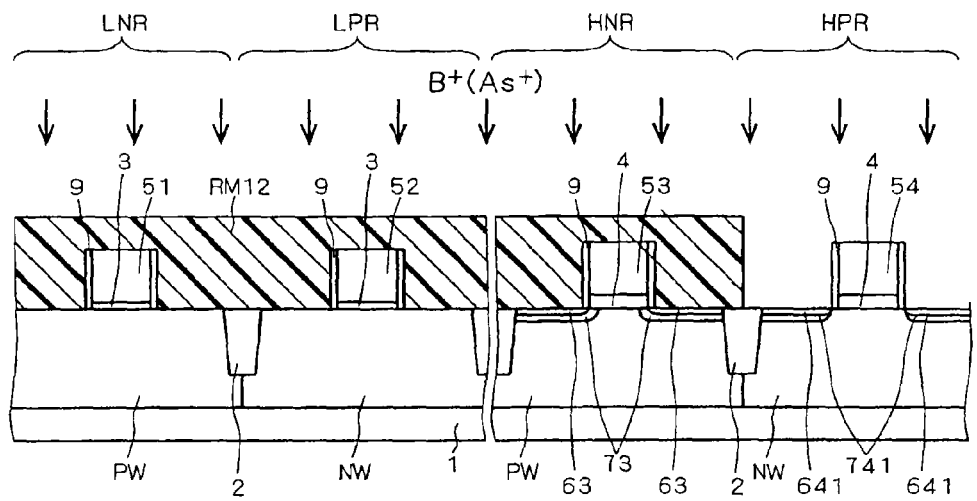

F I G. 23
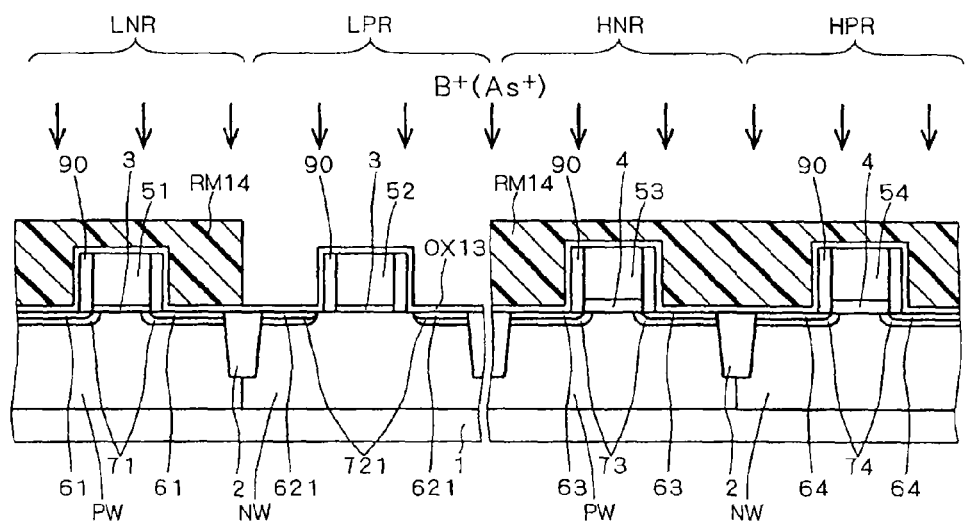
F I G. 24
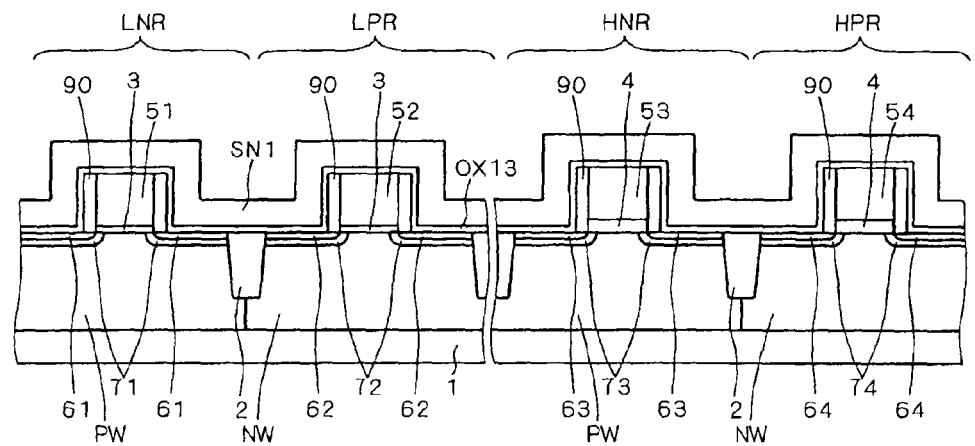

FIG. 34 (BACKGROUD ART)

FIG. 35 (BACKGROUD ART)

F I G. 36 (BACKGROUD ART)
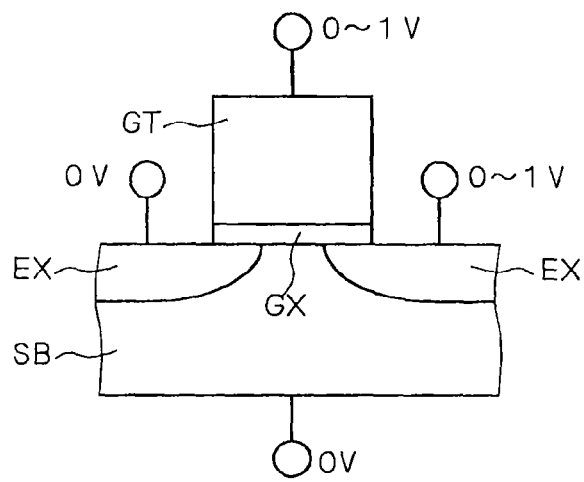
F I G. 37 (BACKGROUD ART)
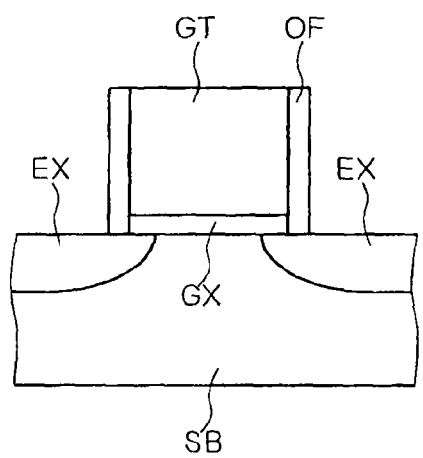

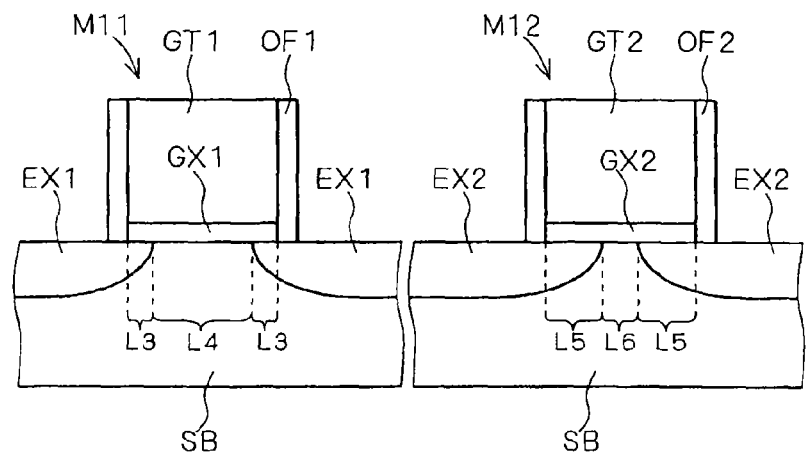
FIG. 38 (BACKGROUD ART)
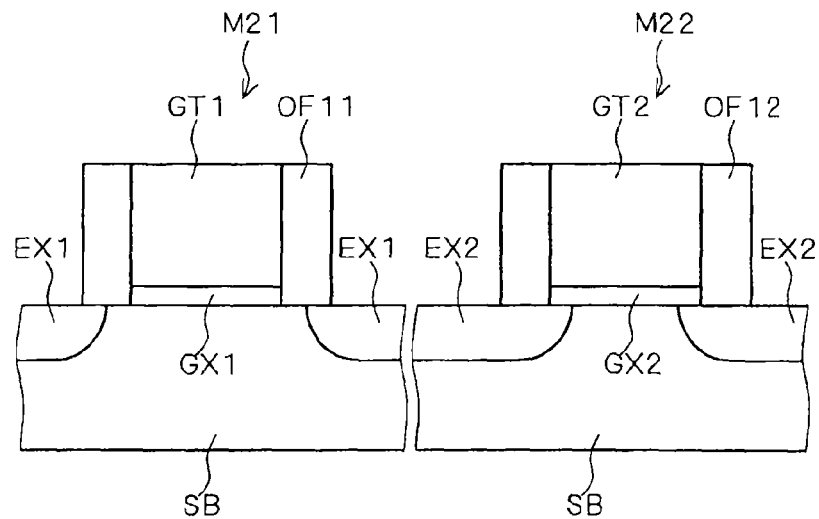
FIG. 39 (BACKGROUD ART)

FIG. 40 (BACKGROUD ART)
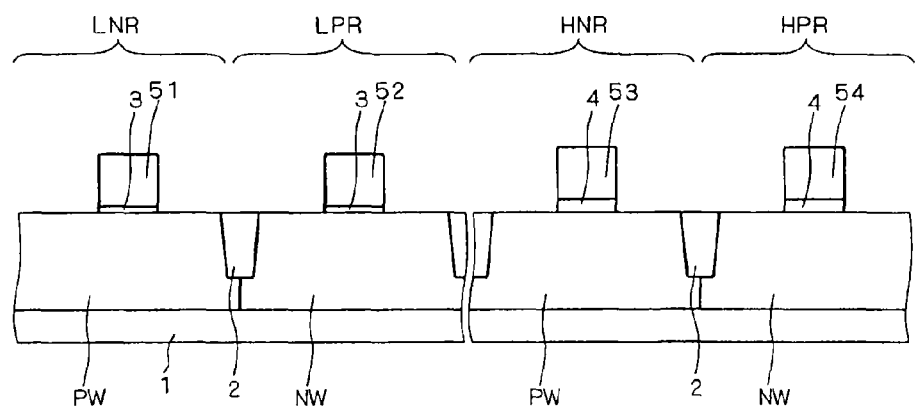
FIG. 41 (BACKGROUD ART)
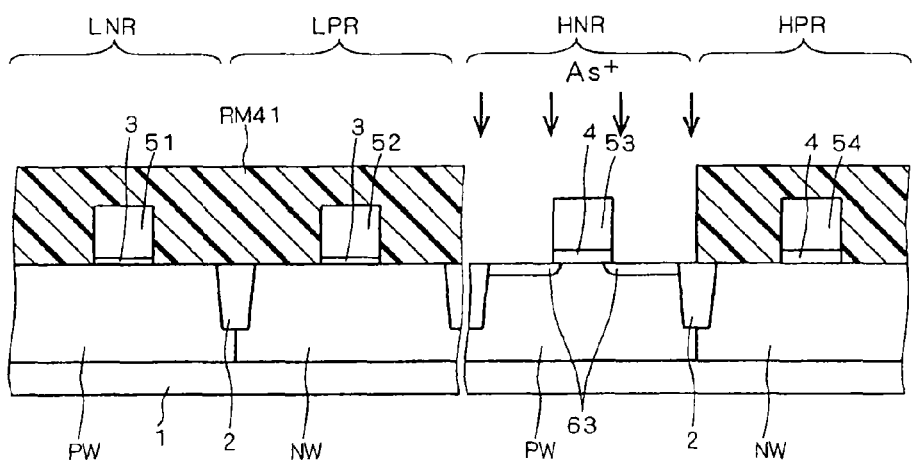

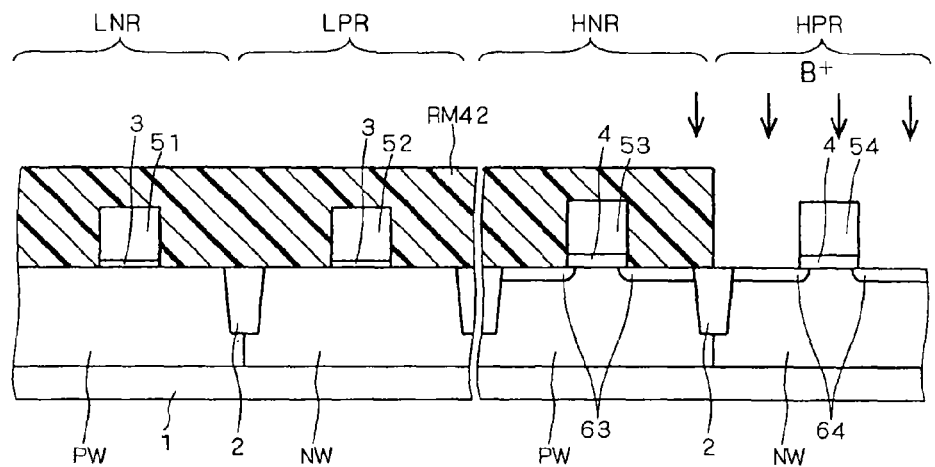
FIG. 42 (BACKGROUD ART)
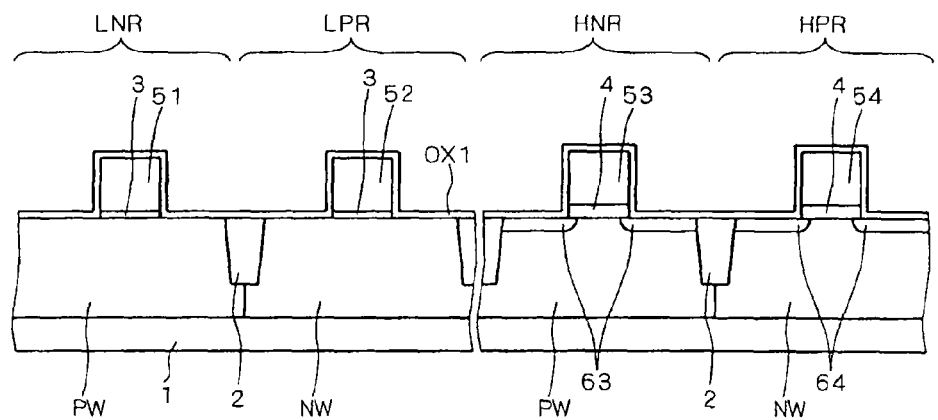
FIG. 43 (BACKGROUD ART)

FIG. 44 (BACKGROUD ART)
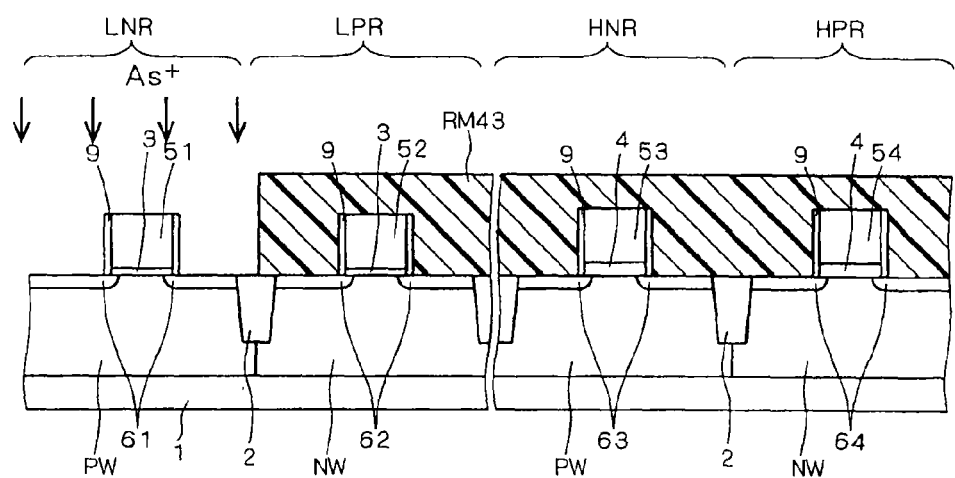
FIG. 45 (BACKGROUD ART)
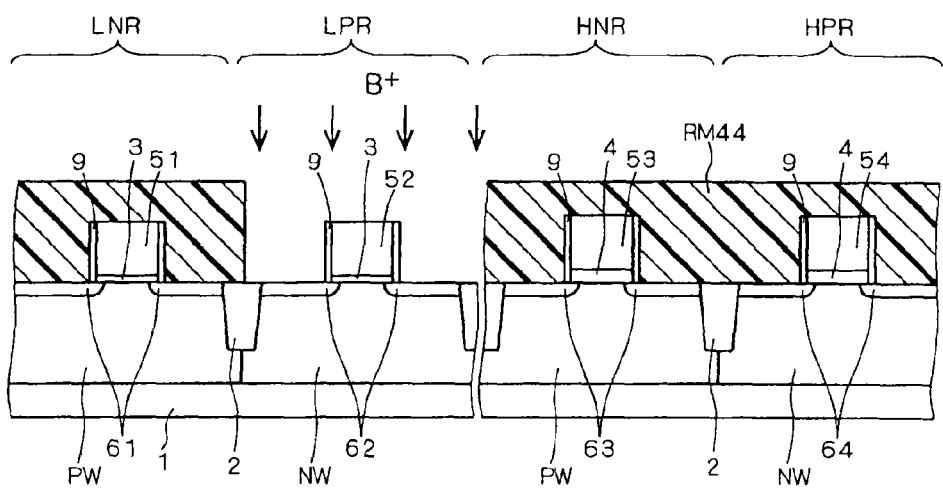

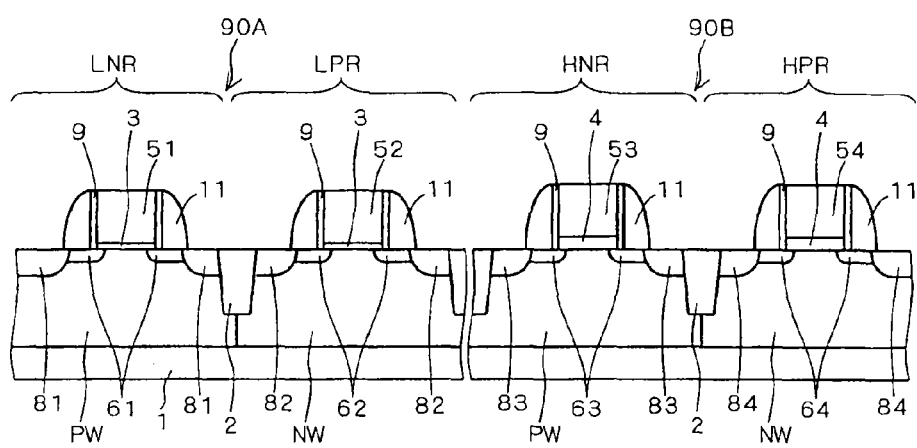
FIG. 46 (BACKGROUD ART)

METHOD OF MANUFACTURING SEMICONDUCTOR DEVICE WITH OFFSET SIDEWALL STRUCTURE

CROSS-REFERENCE TO RELATED APPLICATIONS

This application is a continuation of and claims the benefit of priority under 35 USC §120 from U.S. Ser. No. 13/833,891 filed Mar. 15, 2013, which is a continuation of U.S. Ser. No. 13/185,624 filed Jul. 19, 2011 (now U.S. Pat. No. 8,415,213 issued Apr. 9, 2013), which is a continuation of U.S. Ser. No. 12/484,618 filed Jun. 15, 2009 (now U.S. Pat. No. 7,998,809 issued Aug. 16, 2011), which is a continuation of U.S. Ser. No. 11/743,021 filed May 1, 2007 (now U.S. Pat. No. 7,563,663 issued Jul. 21, 2009), which is a continuation of U.S. Ser. No. 10/212,252 filed Aug. 6, 2002 (now U.S. Pat. No. 7,220,637 issued May 22, 2007), and claims the benefit of priority under 35 U.S.C. §119 from Japanese Patent Application No. 2001-288918 filed Sep. 21, 2001, the entire contents of each of which are incorporated herein by reference.

BACKGROUND OF THE INVENTION

1. Field of the Invention

The present invention relates to a method of manufacturing a semiconductor device, especially a semiconductor device with an offset sidewall structure.

2. Description of the Background Art

In conventional semiconductor devices, impurity ion implantation is performed with gate electrodes as implant masks thereby to form extension layers in a self-aligned manner. The extension layers here are impurity layers which are formed to produce shallower junctions than main source/drain layers later to be formed. The extension layers are of the same conductivity type as the main source/drain layers and function as source/drain layers; thus, they should be referred to as source/drain extension layers but for convenience's sake, they are referred to herein as the extension layers.

In this method, however, the extension layers extend more than necessary under the gate electrodes due to scattering of impurity ions during implantation and diffusion of impurity ions in a subsequent process. This is shown in FIG. 34.

In a MOS transistor M1 shown in FIG. 34, a gate insulating film GX is selectively formed on a semiconductor substrate SB and a gate electrode GT is formed on the gate insulating film GX. In the surface of the semiconductor substrate SB on both sides of the gate electrode GT, a pair of extension layers EX are formed extending under the gate electrode GT. This state is called a gate overlap. In the case of FIG. 34, a gate overlap length of each extension layer EX is represented by L1. As shown, excessive extension of the extension layers EX under the gate electrode GT reduces an effective channel length (L2), thereby making a short channel effect more prominent.

In recent semiconductor devices with minimum gate lengths of less than 0.1 μm, a short channel effect becomes more prominent and a slight reduction of the gate length from the design value will interfere with transistor operation. That is, the short channel effect has become the leading cause of low manufacturing yield. The gate overlap, which brings about a short channel effect, is thus an undesirable phenomenon.

FIG. 35 illustrates in schematic form the MOS transistor M1 in standby mode. As shown in FIG. 35, during standby, a voltage of 0V is applied to the extension layer EX on the source side, a voltage of 1V to the extension layer EX on the drain side and a voltage of 0V to the gate electrode GT and the semiconductor substrate SB. In this case, a leakage current flows between the gate and the drain in proportion to the area of gate-to-drain overlap. In gate insulating films with recent noticeable tendencies of thin film thickness, gate overlaps produce a more prominent gate-drain current leakage, thereby becoming a factor of increase in standby power of LSIs.

FIG. 36 illustrates in schematic form the MOS transistor M1 in operation mode. As shown in FIG. 36, during operation, a voltage of 0V is applied to the extension layer EX on the source side and a voltage of 0 to 1 V to the extension layer EX on the drain side and to the gate electrode GT. The gate and drain voltages may vary in actual circuit operation, in which case a large area of gate overlap causes an increase in parasitic capacitance and requires a greater amount of charge to be applied thereto, thus becoming a big factor of delay in circuit operation.

To eliminate these problems, offset sidewall structures have recently been adopted. FIG. 37 shows one example of an offset sidewall structure. In FIG. 37, like components to those of the MOS transistor M1 shown in FIG. 34 are designated by the same reference numerals and will not be described herein.

Referring to FIG. 37, an offset sidewall OF is formed adjacent to the side surfaces of the gate electrode GT and the gate insulating film GX. After the formation of the offset sidewall OF, the extension layers EX are formed in a self-aligned manner, using the gate electrode GT and the offset sidewall OF as implant masks. Thereby the lengths of the extension layers EX extending under the gate electrode GT can be reduced.

In this method, however, the following inconvenience occurs in semiconductor devices with both N-channel MOS transistors (NMOS transistors) and P-channel MOS transistors (PMOS transistors).

FIG. 38 shows an NMOS transistor M11 and a PMOS transistor M12 formed on the same semiconductor substrate SB.

Referring to FIG. 38, the NMOS transistor M11 comprises a gate insulating film GX1 selectively formed on the semiconductor substrate SB, a gate electrode GT1 formed on the gate insulating film GX1, an offset sidewall OF1 formed adjacent to the side surfaces of the gate electrode GT1 and the gate insulating film GX1, and a pair of extension layers EX1 formed in the surface of the semiconductor substrate SB on both sides of the gate electrode GT1. In this case, the gate overlap lengths of the extension layers EX1 are represented by L3 and an effective channel length is represented by L4.

The PMOS transistor M12 comprises a gate insulating film GX2 selectively formed on the semiconductor substrate SB, a gate electrode GT2 formed on the gate insulating film GX2, an offset sidewall OF2 formed adjacent to the side surfaces of the gate electrode GT2 and the gate insulating film GX2, and a pair of extension layers EX2 formed in the surface of the semiconductor substrate SB on both sides of the gate electrode GT2. In this case, the gate overlap lengths of the extension layers EX2 are represented by L5 and an effective channel length is represented by L6.

A comparison between the NMOS transistor M11 and the PMOS transistor M12 indicates that the gate overlap length L3 of the NMOS transistor M11 is shorter than the gate overlap length L5 of the PMOS transistor M12 and thus, the effective channel length L4 is longer than L6.

This is because boron (B) which is generally used as source and drain impurities for PMOS transistors has a much higher diffusion rate within silicon than arsenic (As) which is generally used as source and drain impurities for NMOS transistors.

That is, even if ion implantations of As and B produce implanted layers of the same shape, B will diffuse more widely in a subsequent heat treatment process and thereby the extension layers EX2 of the PMOS transistor M12 have a greater gate overlap length than the extension layers EX1 of the NMOS transistor M11.

This results in a more prominent short channel effect of the PMOS transistor M12, an increase in gate-drain parasitic capacitance, and an increase in gate-drain current leakage.

FIG. 39 illustrates an NMOS transistor (NMOSFET) M21 and a PMOS transistor (PMOSFET) M22 formed on the same semiconductor substrate SB. These transistors M21 and M22 differ from the NMOS transistor M11 and the PMOS transistor M12 of FIG. 38 in that their respective offset sidewalls OF11 and OF12 are greater in width than the offset sidewalls OF1 and OF2, respectively.

By expanding the width of the offset sidewall, the PMOS transistor M22 can have a shorter gate overlap length and a longer effective channel length. In the NMOS transistor M21, however, because of the expanded width of the offset sidewall OF11, doped impurities cannot extend under the gate electrode GT1 even by heat treatment during process, no gate overlaps occur, and thus isolation is established between the source and drain of the NMOS transistor M21, thereby causing a reduction in operating current.

Now, as one example of a conventional method of manufacturing a semiconductor device with both NMOS and PMOS transistors, a method of manufacturing a semiconductor device with CMOS transistors 90A and 90B will be described with reference to FIGS. 40 through 46, which are cross-sectional views illustrating the manufacturing process step by step. The CMOS transistor 90A is low-voltage compliant and the CMOS transistor 90B is high-voltage compliant, their respective structures being illustrated in the final step of FIG. 46.

Referring first to FIG. 40, an element isolation insulating film 2 is selectively formed in the surface of a silicon substrate 1 to define a low-voltage NMOS region LNR for forming a low-voltage NMOS transistor, a low-voltage PMOS region LPR for forming a low-voltage PMOS transistor, a high-voltage NMOS region HNR for forming a high-voltage NMOS transistor and a high-voltage PMOS region HPR for forming a high-voltage PMOS transistor. The low-voltage NMOS and PMOS regions LNR and LPR may generically be referred to as a low-voltage circuit portion, and the high-voltage NMOS and PMOS regions HNR and HPR may generically be referred to as a high-voltage circuit portion.

In the surface of the silicon substrate 1, P-well regions PW containing P-type impurities are formed corresponding to the low-voltage NMOS region LNR and the high-voltage NMOS region HNR, and N-well regions NW containing N-type impurities are formed corresponding to the low-voltage PMOS region LPR and the high-voltage PMOS region HPR. In the following description, the P-well regions PW and the N-well regions NW may be simply referred to as the silicon substrate without distinction.

Then, a first insulation film such as silicon oxide film is formed to a first thickness to cover the whole surface of the silicon substrate 1. After that, a resist mask is formed to expose the low-voltage circuit portion and the first insulation film is removed from the low-voltage circuit portion by, for example, hydrofluoric acid treatment.

The resist mask is then removed and a second insulation film such as silicon oxide film is formed to a second thickness to cover the whole surface of the silicon substrate 1. Thereby the low-voltage circuit portion has an insulation film of the second thickness formed thereon and the high-voltage circuit portion has a third insulation film formed thereon which is greater in thickness than the first insulation film.

After a polysilicon layer is formed on the whole surface of the silicon substrate 1, the polysilicon layer and the second and third insulation films thereunder are patterned to selectively form gate electrodes and gate insulating films in both the low voltage and high-voltage circuit portions. FIG. 40 shows the state after the patterning, wherein in the low-voltage NMOS region LNR and the low-voltage PMOS region LPR, gate electrodes 51 and 52 respectively are formed on selectively formed gate insulating films 3 and in the high-voltage NMOS region HNR and the high-voltage PMOS region HPR, gate electrodes 53 and 54 respectively are formed on selectively formed gate insulating films 4.

In the step of FIG. 41, an N-type impurity such as arsenic (As) is ion implanted to a relatively low concentration into the surface of the silicon substrate 1 in the high-voltage NMOS region HNR, thereby to form a pair of extension layers 63. FIG. 41 shows that the upper portion other than that of the high-voltage NMOS region HNR is covered with a resist mask RM41 by photolithographic patterning and an N-type impurity is ion implanted into the high-voltage NMOS region HNR with the gate electrode 53 as an implant mask.

The pair of extension layers 63 are opposed to each other with the silicon substrate 1 under the gate electrode 53 sandwiched in between. In this case, an area of the silicon substrate 1 under the gate electrode 53 forms a channel region.

In the step of FIG. 42, a P-type impurity such as boron (B) is ion implanted to a relatively low concentration into the surface of the silicon substrate 1 in the high-voltage PMOS region HPR, thereby to form a pair of extension layers 64. FIG. 42 shows that the upper portion other than that of the high-voltage PMOS region HPR is covered with a resist mask RM42 by photolithographic patterning and a P-type impurity is ion implanted into the high-voltage PMOS region HPR with the gate electrode 54 as an implant mask.

The pair of extension layers 64 are opposed to each other with the silicon substrate 1 under the gate electrode 54 sandwiched in between. In this case, an area of the silicon substrate 1 under the gate electrode 54 forms a channel region.

In the step of FIG. 43, a silicon oxide film OX1 is formed to cover the whole surface of the silicon substrate 1. The silicon oxide film OX1 is then wholly etched back by anisotropic etching so as to leave the silicon oxide film OX1 only on the side surfaces of the gate electrodes 51 to 54 to form offset sidewalls 9.

In the step of FIG. 44, an N-type impurity such as arsenic (As) is ion implanted to a relatively low concentration into the surface of the silicon substrate 1 in the low-voltage NMOS region LNR, thereby to form a pair of extension layers 61. FIG. 44 shows that the upper portion other than that of the low-voltage NMOS region LNR is covered with a resist mask RM43 by photolithographic patterning and an N-type impurity is ion implanted into the low-voltage NMOS region LNR with the gate electrode 51 and the offset sidewall 9 as implant masks.

The pair of extension layers 61 are opposed to each other with the silicon substrate 1 under the gate electrode 51 sandwiched in between. In this case, an area of the silicon substrate 1 under the gate electrode 51 forms a channel region.

In the step of FIG. 45, a P-type impurity such as boron (B) is ion implanted to a relatively low concentration into the surface of the silicon substrate 1 in the low-voltage PMOS region LPR, thereby form a pair of extension layers 62. FIG.

45 shows that the upper portion other than that of the low-voltage PMOS region LPR is covered with a resist mask RM44 by photolithographic patterning and a P-type impurity is ion implanted into the low-voltage PMOS region LPR with the gate electrode 52 and the offset sidewall 9 as implant masks.

The pair of extension layers 62 are opposed to each other with the silicon substrate 1 under the gate electrode 52 sandwiched in between. In this case, an area of the silicon substrate 1 under the gate electrode 52 forms a channel region.

In the step of FIG. 46, after an insulation film such as silicon nitride film is formed to cover the whole surface of the silicon substrate 1, the silicon nitride film is wholly etched back by anisotropic etching to form sidewall insulating films 11 on the side surfaces of the offset sidewalls 9.

Thereafter, in the low-voltage NMOS region LNR, using the gate electrode 51, the offset sidewall 9 and the sidewall insulating film 11 as implant masks, an N-type impurity is ion implanted to a relatively high concentration to form a pair of source/drain layers 81. In the low-voltage PMOS region LPR, using the gate electrode 52, the offset sidewall 9 and the sidewall insulating film 11 as implant masks, a P-type impurity is ion implanted to a relatively high concentration to form a pair of source/drain layers 82.

In the high-voltage NMOS region HNR, using the gate electrode 53, the offset sidewall 9 and the sidewall insulating film 11 as implant masks, an N-type impurity is ion implanted to a relatively high concentration to form a pair of source/drain layers 83. In the high-voltage PMOS region HPR, using the gate electrode 54, the offset sidewall 9 and the sidewall insulating film 11 as implant masks, a P-type impurity is ion implanted to a relatively high concentration to form a pair of source/drain layers 84.

Through the aforementioned steps, the semiconductor device with the CMOS transistors 90A and 90B can be obtained.

In conventional techniques, as above described, although the extension layers in the low-voltage circuit portion and those in the high-voltage circuit portion have been formed in different steps, impurity ion implantations into the PMOS transistor and the NMOS transistor for formation of the extension layers have been performed under the same implant conditions.

Thus, the degrees of gate overlaps of the extension layers vary between the NMOS transistor and the PMOS transistor depending on a difference in diffusion rate in the silicon substrate between the N-type impurity (As) and the P-type impurity (B).

SUMMARY OF THE INVENTION

It is an object of the present invention to provide a method of manufacturing a semiconductor device with NMOS and PMOS transistors, which is capable of lessening a short channel effect, reducing gate-drain current leakage and reducing parasitic capacitance due to gate overlaps, thereby preventing a reduction in the operating speed of circuits.

According to the present invention, the method of manufacturing a semiconductor device includes the following steps (a) to (c). The step (a) is to section a major surface of a semiconductor substrate into at least a first NMOS region for forming a first NMOS transistor and a first PMOS region for forming a first PMOS transistor. The step (b) is to selectively form a first gate insulating film in both the first NMOS region and the first PMOS region to form a first gate electrode and a second gate electrode on the first gate insulating film in the first NMOS region and the first PMOS region, respectively. The step is to ion implant an N-type impurity using at least the first gate electrode as part of an implant mask to form a pair of first extension layers in the surface of the semiconductor substrate outside a side surface of the first gate electrode, and to ion implant a P-type impurity using at least the second gate electrode as part of an implant mask to form a pair of second extension layers in the surface of the semiconductor substrate outside a side surface of the second gate electrode. The step (c) includes the step of (c-1) forming first ion-implanted layers by ion implantation of the N-type impurity and second ion-implanted layers by ion implantation of the P-type impurity so that a spacing between the second ion-implanted layers is wider than a spacing between the first ion-implanted layers.

In the method of manufacturing a semiconductor device according to the present invention, since the spacing between the second ion-implanted layers formed by ion implantation of a P-type impurity is wider than that between the first ion-implanted layers formed by ion implantation of an N-type impurity, the second ion-implanted layers are spaced from the second gate electrode. Thus, even if the P-type impurity which diffuses more easily is diffused by a subsequent heat treatment process, the gate overlap length of the second extension layers can be prevented from being longer than that of the first extension layers. Such a configuration can prevent the PMOS transistor from having a more prominent short channel effect and can prevent a reduction in the operating speed of circuits due to an increase in gate-drain parasitic capacitance. It can also prevent an increase in gate-drain current leakage, thereby inhibiting an increase in standby power consumption.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 1 to 13 are diagrams illustrating the manufacturing process of a semiconductor device according to a first preferred embodiment of the present invention;

FIGS. 14 to 28 are diagrams illustrating the manufacturing process of a semiconductor device according to a second preferred embodiment of the present invention;

FIG. 34 is a diagram showing that extension layers extend more than necessary under a gate electrode;

FIGS. 35 to 37 are diagrams for explaining problems occurring when the extension layers extend more than necessary under the gate electrode;

FIG. 38 is a diagram of a configuration for preventing excessive extension of the extension layers under the gate electrode;

FIG. 39 is a diagram for explaining a problem of the configuration for preventing excessive extension of the extension layers under the gate electrode; and FIGS. 40 to 46 are diagrams illustrating the manufacturing process of a conventional semiconductor device.

DESCRIPTION OF THE PREFERRED EMBODIMENTS

A. First Preferred Embodiment

<A-1. Manufacturing Method>

Figure 3:
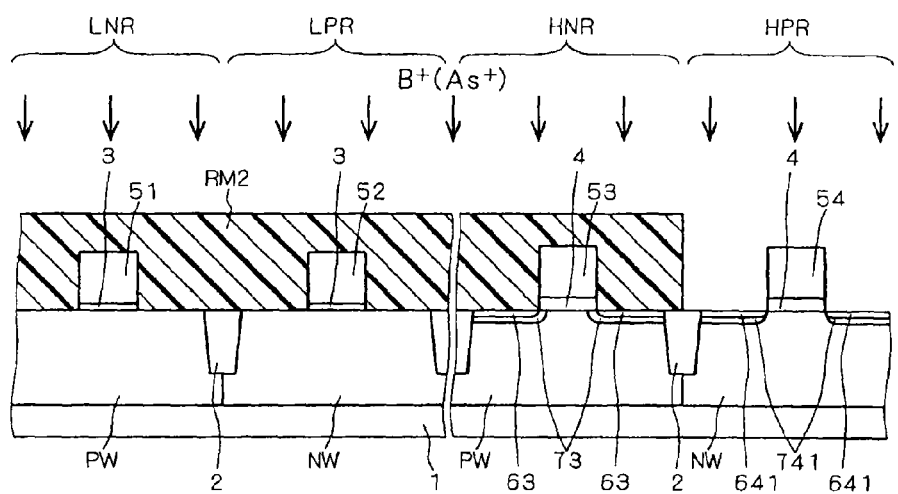

As one example of a method of manufacturing a semiconductor device according to a first preferred embodiment of the present invention, a method of manufacturing a semiconductor device with CMOS transistors 100A and 100B will be described with reference to FIGS. 1 to 13, which are cross-sectional views illustrating the manufacturing process step by step. The CMOS transistor 100A is low-voltage compliant and the CMOS transistor 100B is high-voltage compliant, their respective structures being illustrated in the final step of FIG. 13.

Referring first to FIG. 1, an element isolation insulating films 2 is selectively formed in the surface of a silicon substrate 1 thereby to define a low-voltage NMOS region LNR for forming a low-voltage NMOS transistor, a low-voltage PMOS region LPR for forming a low-voltage PMOS transistor, a high-voltage NMOS region HNR for forming a high-voltage NMOS transistor and a high-voltage PMOS region HPR for forming a high-voltage PMOS transistor. The low-voltage NMOS and PMOS regions LNR and LPR may generically be referred to as a low-voltage circuit portion, and the high-voltage NMOS and PMOS regions HNR and HPR may generically be referred to as a high-voltage circuit portion.

In the surface of the silicon substrate 1, P-well regions PW containing P-type impurities are formed corresponding to the low-voltage NMOS region LNR and the high-voltage NMOS region HNR, and N-well regions NW containing N-type impurities are formed corresponding to the low-voltage PMOS region LPR and the high-voltage PMOS region HPR. In the following description, the P-well regions PW and the N-well regions NW may be referred to simply as the silicon substrate without distinction.

Then, a first silicon oxide film with a thickness of 2 to 8 nm is formed to cover the whole surface of the silicon substrate 1. After that, a resist mask is formed to expose the low-voltage circuit portion and the first silicon oxide is removed from the low-voltage circuit portion by, for example, hydrofluoric acid treatment.

The resist film is then removed and a second silicon oxide film with a thickness of 0.5 to 3 nm is formed to cover the whole surface of the silicon substrate 1. Thereby the low-voltage circuit portion has the second oxide film formed thereon, and the high-voltage circuit portion has a third insulation film formed thereon which has a thickness of 2 to 9 nm greater than that of the first insulation film.

After a polysilicon layer is formed on the whole surface of the silicon substrate 1, the polysilicon layer and the second and third insulation films thereunder are patterned to selectively form gate electrodes and gate insulating films in both the low-voltage and high-voltage circuit portions. At this time, the minimum gate length is in the range of 0.015 to 0.10 μm.

The film thickness of the polysilicon layer is in the range of, for example, 50 to 200 nm. The polysilicon layer may be replaced by a polysilicon germanium layer or a multilayer structure of a polysilicon layer and a polysilicon germanium layer. Further, the polysilicon layer may previously be implanted with impurities; or after formation of an undoped polysilicon layer, the undoped polysilicon layer in NMOS regions may be implanted with an N-type impurity such as phosphorous (P) and the undoped polysilicon layer in PMOS regions may be implanted with a P-type impurity such as boron (B). Of course, the undoped polysilicon may be used without any implantation. The concentration of impurities in the polysilicon layer should be in the range of $1\times10^{19}$ to $1\times10^{21}$ cm$^{-3}$.

FIG. 1 shows the state after patterning, wherein in the low-voltage NMOS region LNR and the low-voltage PMOS region LPR, gate electrodes 51 and 52 respectively are formed on selectively formed gate insulating films 3 and in the high-voltage NMOS region HNR and the high-voltage PMOS region HPR, gate electrodes 53 and 54 respectively are formed on selectively formed gate insulating films 4.

In the step of FIG. 2, an N-type impurity such as arsenic (As) is ion implanted to a relatively low concentration into the surface of the silicon substrate 1 in the high-voltage NMOS region HNR, thereby to form a pair of N-type impurity layers 631 (extension implantation).

The ion implant conditions for arsenic are an implant energy of 10 to 50 keV and a dose of $5\times10^{12}$ to $1\times10^{14}$ cm$^2$. The ion implant conditions for phosphorous (P) are an implant energy of 10 to 30 keV and a dose of $5\times10^{12}$ to $1\times10^{14}$ cm$^{-2}$. Alternatively, implantation may be performed with a mixture of those ions.

Then, a P-type impurity such as boron (B) is ion implanted into the silicon substrate 1 to form a pair of P-type impurity layers 731 (pocket implantation). The implant conditions at this time are an implant energy of 3 to 15 keV and a dose of $1\times10^{12}$ to $1\times10^{13}$ cm$^{-2}$.

FIG. 2 shows that the upper portion other than that of the high-voltage NMOS region I-INR is covered with a resist mask RM1 by photolithographic patterning and the extension and pocket implantations are performed on the high-voltage NMOS region HNR with the gate electrode 53 as an implant mask.

The pair of N-type impurity layers 631 and the pair of P-type impurity layers 731 grow into a pair of extension layers 63 and a pair of pocket layers 73 respectively through heat treatment. The pair of extension layers 63 are opposed to each other with the silicon substrate 1 under the gate electrode 53 sandwiched in between. In this case, an area of the silicon substrate 1 under the gate electrode 53 forms a channel region. The pair of extension layers 63 and the pair of pocket layers 73 are shown in FIG. 3 and the following figures.

In the pocket implantation, the silicon substrate 1 is inclined at a predetermined angle relative to an axis of implantation and when implantation from a predetermined direction is completed, then the silicon substrate 1 is rotated a predetermined angle for next implantation. That is, with intermittent rotation of the silicon substrate 1, an N-type impurity may be implanted at an angle into the silicon substrate 1 outside the side surface of the gate electrode 53.

If we assume that the angle of inclination of the silicon substrate 1 is 0° when the silicon substrate 1 is perpendicular to the axis of implantation, it should be in the range of 0° to 50°. By inclining the silicon substrate 1, the pocket layers 73 are formed extending at an angle with respect to the major surface of the silicon substrate 1 and have their respective tip portions extending under the gate electrode 53. It is desirable that the pocket layers 73 extend as far as possible under the gate electrode 53; however, even if the inclination angle is 0°, i.e., when the axis of implantation is perpendicular to the silicon substrate 1, implanted ions will spread out horizontality due to scattering and a subsequent thermal diffusion process and thereby the pocket layers 73 will extend under the gate electrode 53.

Further, ion scattering becomes more prominent as the implantation becomes deeper and the pocket implantation is performed in a deeper region than the extension implantation. From this, the pocket implantation causes a more lateral spread of ions, whereby the extension layers 63 are covered with the pocket layers 73.

The pocket layers 73 contain an impurity of the opposite conductivity type to the source/drain layers and are provided for the purpose of restricting the lateral spread of a depletion layer from the drain layer to prevent punch-through. The pocket layers 73, however, increase the impurity concentration only locally under the gate electrode 53 and thus never increase the threshold voltage. It should be noted that the pocket implantation is not an absolute necessity.

In the step of FIG. 3, a P-type impurity such as boron (B) is ion implanted to a relatively low concentration into the surface of the silicon substrate 1 in the high-voltage PMOS region HPR, thereby to form a pair of P-type impurity layers 641.

The ion implant conditions for boron are an implant energy of 3 to 20 keV and a dose of $5 \times 10^{12}$ to $1 \times 10^{14}$ cm$^{-2}$. The ion implant conditions for boron difluoride (BF$_2$) are an implant energy of 15 to 100 keV and a dose of $5 \times 10^{12}$ to $1 \times 10^{14}$ cm$^{-2}$.

Then, an N-type impurity such as arsenic is ion implanted into the silicon substrate 1 to form a pair of N-type impurity layers 741. The ion implant conditions for arsenic are an implant energy of 40 to 140 keV and a dose of $1 \times 10^{12}$ to $1 \times 10^{13}$ cm$^{-2}$.

The ion implant conditions for phosphorous are an implant energy of 20 to 70 keV and a dose of $1 \times 10^{12}$ to $1 \times 10^{13}$ cm$^{-2}$. Alternatively, implantation may be performed with a mixture of those ions. In the pocket implantation, it is desirable, as above described, that the silicon substrate 1 be inclined at a predetermined angle relative to the axis of implantation and rotated intermittently.

FIG. 3 shows that the upper portion other than that of the high-voltage PMOS region HPR is covered with a resist mask RM2 by photolithographic patterning and the extension and pocket implantations are performed on the high-voltage PMOS region HPR with the gate electrode 54 as an implant mask.

The pair of P-type impurity layers 641 and the pair of N-type impurity layers 741 grow into a pair of extension layers 64 and a pair of pocket layers 74 respectively through heat treatment. The pair of extension layers 64 are opposed to each other with the silicon substrate 1 under the gate electrode 54 sandwiched in between. In this case, an area of the silicon substrate 1 under the gate electrode 54 forms a channel region. The pair of extension layers 64 and the pair of pocket layers 74 are shown in FIG. 4 and the following figures.

Figure 4:
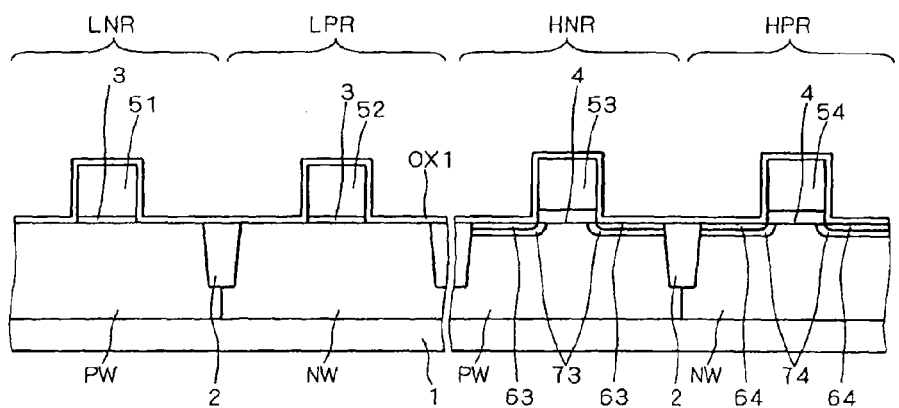
Figure 5:
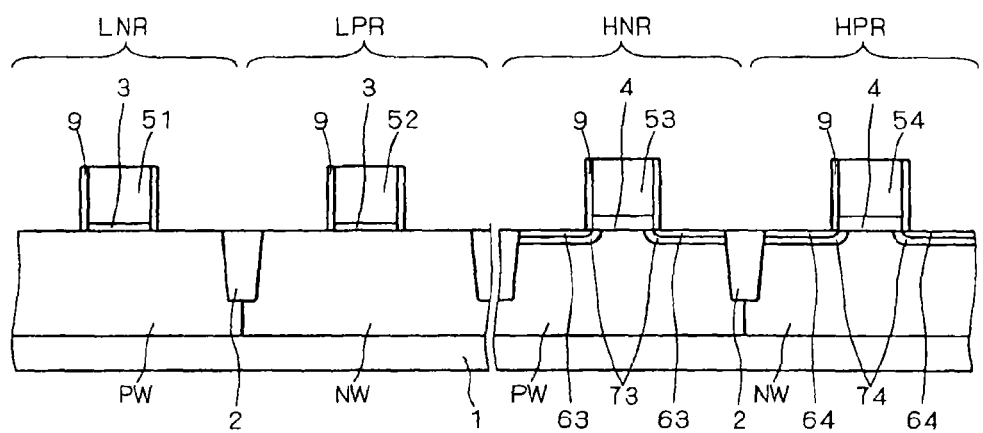

In the step of FIG. 4, a silicon oxide film OX1 is formed to cover the whole surface of the silicon substrate 1. The silicon oxide film OX1 has a thickness of 5 to 30 nm. Then, in the step of FIG. 5, the silicon oxide film OX1 is wholly etched back by anisotropic etching so as to leave the silicon oxide film OX1 only on the side surfaces of the gate electrodes 51 to 54 to form offset sidewalls 9.

In the formation of the offset sidewalls 9, the etch back of the silicon oxide film OX1 is performed, in which case the silicon substrate 1 can be etched slightly (a few nanometers). Thus, selective epitaxial growth may be performed after the formation of the offset sidewalls 9 to restore the silicon substrate 1 removed by etching.

Selective epitaxial growth uses silane gas as a source gas in a CVD (chemical vapor deposition) apparatus at a growth temperature of 500 to 800° C., thereby allowing crystal growth of silicon only on silicon layers such as the source/drain layers. In this case, in order to prevent the growth of silicon on oxide films, a crystal-growth rate should preferably be maintained at 10 Å/sec or less. It goes without saying that when the etching of the silicon substrate 1 does not present much of a problem, this process is unnecessary.

Figure 6:
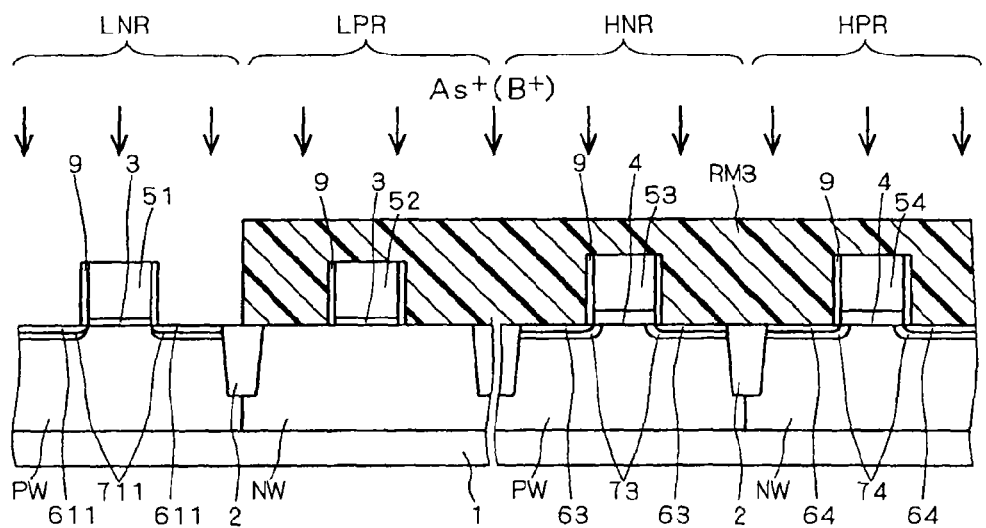

In the step of FIG. 6, an N-type impurity such as arsenic is ion implanted to a relatively low concentration into the surface of the silicon substrate 1 in the low-voltage NMOS region LNR, thereby to form a pair of N-type impurity layers 611.

The ion implant conditions for arsenic are an implant energy of 0.1 to 10 keV and a dose of $2 \times 10^{14}$ to $5 \times 10^{15}$ cm$^{-2}$.

Then, a P-type impurity such as boron is ion implanted into the silicon substrate 1 to form a pair of P-type impurity layers 711. The ion implant conditions at this time are an implant energy of 3 to 15 keV and a dose of $1 \times 10^{13}$ to $5 \times 10^{13}$ cm$^{-2}$. In the pocket implantation, it is desirable, as above described, that the silicon substrate 1 be inclined at a predetermined angle relative to the axis of implantation and rotated intermittently.

FIG. 6 shows that the upper portion other than that of the low-voltage NMOS region LNR is covered with a resist mask RM3 by photolithographic patterning and the extension and pocket implantations are performed on the low-voltage NMOS region LNR with the gate electrode 51 and the offset sidewall 9 as implant masks.

The pair of N-type impurity layers 611 and the pair of P-type impurity layers 711 grow into a pair of extension layers 61 and a pair of pocket layers 71 respectively through heat treatment. The pair of extension layers 61 are opposed to each other with the silicon substrate 1 under the gate electrode 51 sandwiched in between. In this case, an area of the silicon substrate 1 under the gate electrode 51 forms a channel region. The pair of extension layers 61 and the pair of pocket layers 71 are shown in FIG. 7 and the following figures.

Figure 7:
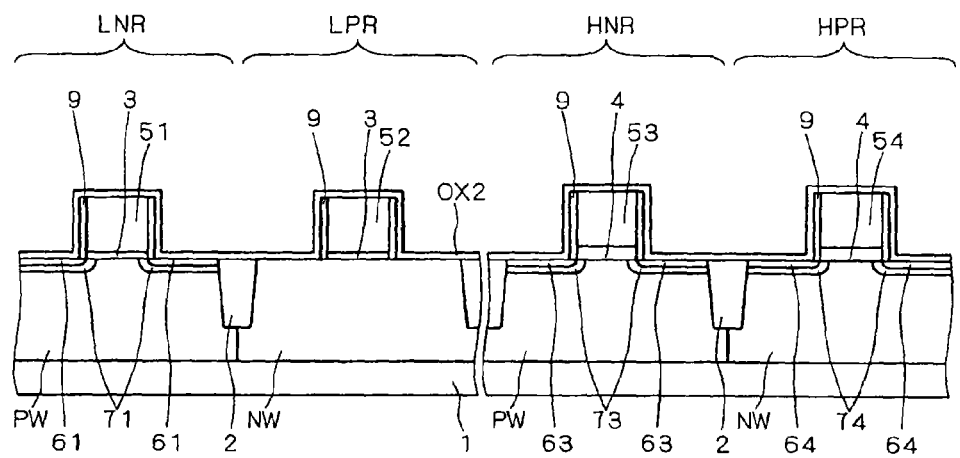

In the step of FIG. 7, a silicon oxide film OX2 is formed to cover the whole surface of the silicon substrate 1. The silicon oxide film OX2 has a thickness of 5 to 30 nm. It acts as an offset sidewall on the side surfaces of the gate electrodes 51 to 54 and in a later step, unnecessary parts thereof are removed to form offset sidewalls 10. Alternatively, the silicon oxide film OX2 may be etched back at this step so that it remains only on the side surfaces of the gate electrodes and the gate insulating film.

Figure 8:
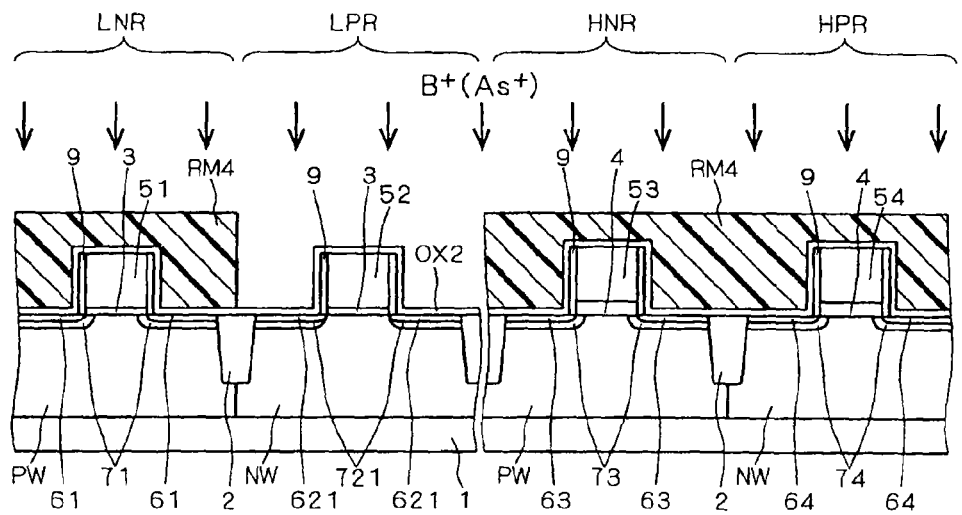

In the step of FIG. 8, a P-type impurity such as boron is ion implanted to a relatively low concentration into the surface of the silicon substrate 1 in the low-voltage PMOS region LPR, thereby to form a pair of P-type impurity layers 621.

The ion implant conditions for boron are an implant energy of 0.1 to 5 keV and a dose of $1 \times 10^{14}$ to $5 \times 10^{15}$ cm$^{-2}$. When the extension implantation is performed without removing the silicon oxide film OX2 on the surface of the silicon substrate 1, some of implanted boron ions will stay within the silicon oxide film OX2. Such boron ions in the silicon oxide film OX2, however, will be diffused into the silicon substrate 1 by a subsequent heat treatment process and will join the extension layers.

Then, an N-type impurity such as arsenic is ion implanted into the silicon substrate 1 to form a pair of N-type impurity layers 721. The ion implant conditions at this time are an implant energy of 30 to 120 keV and a dose of $1 \times 10^{13}$ to $5 \times 10^{13}$ cm$^{-2}$. In the pocket implantation, it is desirable, as above described, that the silicon substrate 1 be inclined at a predetermined angle relative to the axis of implantation and rotated intermittently.

FIG. 8 shows that the upper portion other than that of the low-voltage PMOS region LPR is covered with a resist mask RM4 by photolithographic patterning and the extension and pocket implantations are performed on the low-voltage PMOS region LPR with the gate electrode 52, the offset sidewall 9 and the silicon oxide film OX2 on the gate electrode 52 as implant masks.

The pair of P-type impurity layers 621 and the pair of N-type impurity layers 721 grow into a pair of extension layers 62 and a pair of pocket layers 72 respectively through heat treatment. The extension layers 62 are opposed to each other with the silicon substrate 1 under the gate electrode 52 sandwiched in between. In this case, an area of the silicon substrate 1 under the gate electrode 52 forms a channel region. The pair of extension layers 62 and the pair of pocket layers 72 are shown in FIG. 9 and the following figures.

Figure 9:
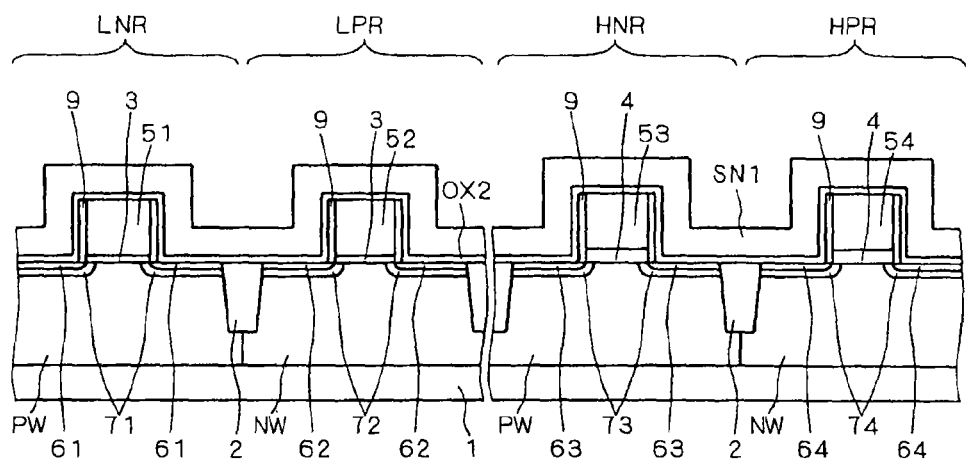

In the step of FIG. 9, a silicon nitride film SN1 is formed to cover the whole surface of the silicon substrate 1. The silicon nitride film SN1 has a thickness of 30 to 100 nm.

Figure 10:
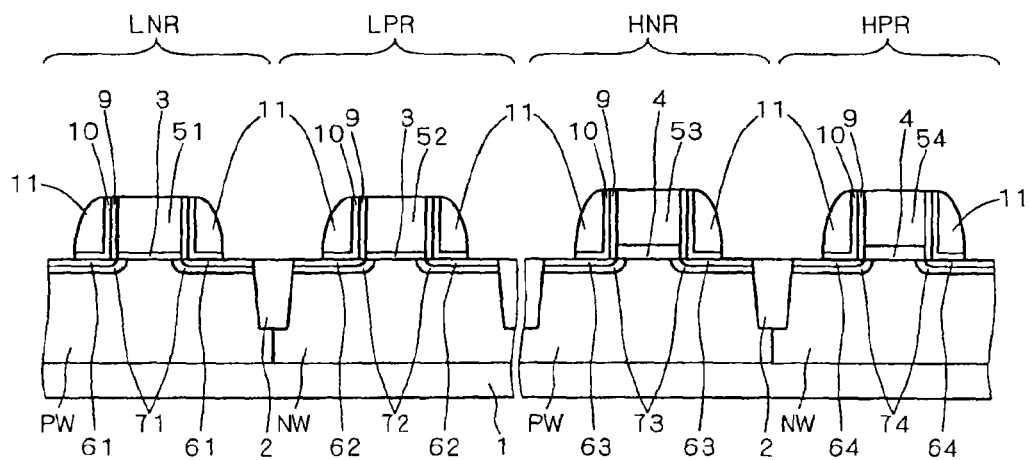

In the step of FIG. 10, the silicon nitride film SN1 is wholly etched back by anisotropic etching so as to leave the silicon nitride film SN1 on the side surfaces of the gate electrodes 51 to 54, more specifically, on the side surfaces of the offset sidewalls 10 on the side surfaces of the gate electrodes 51 to 54 thereby to form sidewall insulating films 11.

The offset sidewalls 10 are obtained by, after the etch back of the silicon nitride film SN1, removing the silicon oxide film OX2 formed on the gate electrodes 51 to 54 and on the silicon substrate 1.

Figure 11:
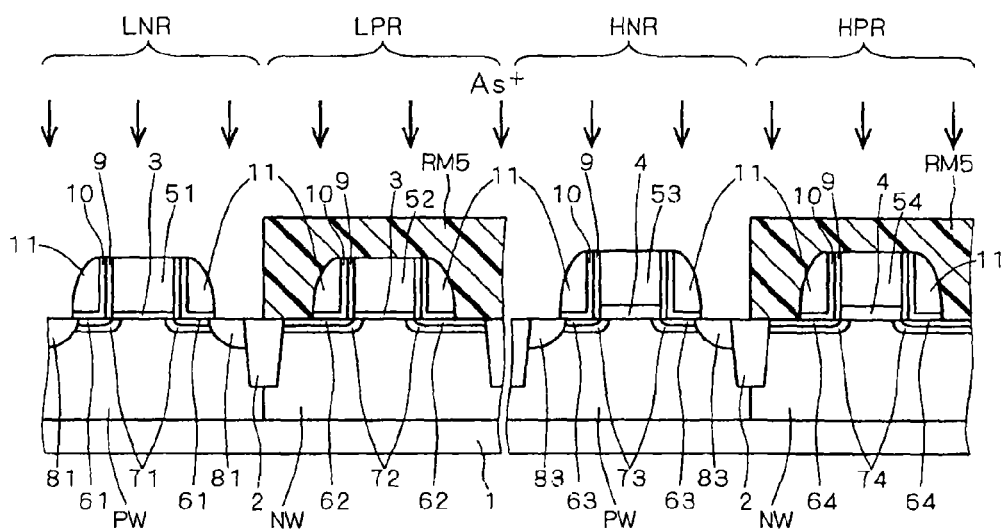

In the step of FIG. 11, an N-type impurity such as arsenic is ion implanted to a relatively high concentration into the surface of the silicon substrate 1 in the low-voltage NMOS region LNR and the high-voltage NMOS region HNR, thereby to form a pair of source/drain layers 81 and a pair of source/drain layers 83, respectively (source/drain implantation).

The ion implant conditions for arsenic are an implant energy of 10 to 100 keV and a dose of $1 \times 10^{15}$ to $5 \times 10^{16}$ cm$^{-2}$.

After the source/drain implantation, implanted impurity ions are activated by heat treatment. The heat treat conditions employed herein are a heat treatment temperature of 800 to 1100° C. and a heat treatment time (which is defined as the time during which the maximum temperature can be maintained) of 0 to 30 seconds. Even if the heat treatment time is 0 seconds, the heat treatment can proceed during times until the maximum temperature is reached and until the maximum temperature drops to room temperatures.

FIG. 11 shows that the upper portion other than those of the low-voltage NMOS region LNR and the high-voltage NMOS region HNR is covered with a resist mask RM5 by photolithographic patterning and the source/drain implantation is performed on the low-voltage NMOS region LNR using the gate electrode 51, the offset sidewall 9, the offset sidewall 10 and the sidewall insulating film 11 as implant masks and on the high-voltage NMOS region HNR using the gate electrode 53, the offset sidewall 9, the offset sidewall 10 and the sidewall insulating film 11 as implant masks.

Figure 12:
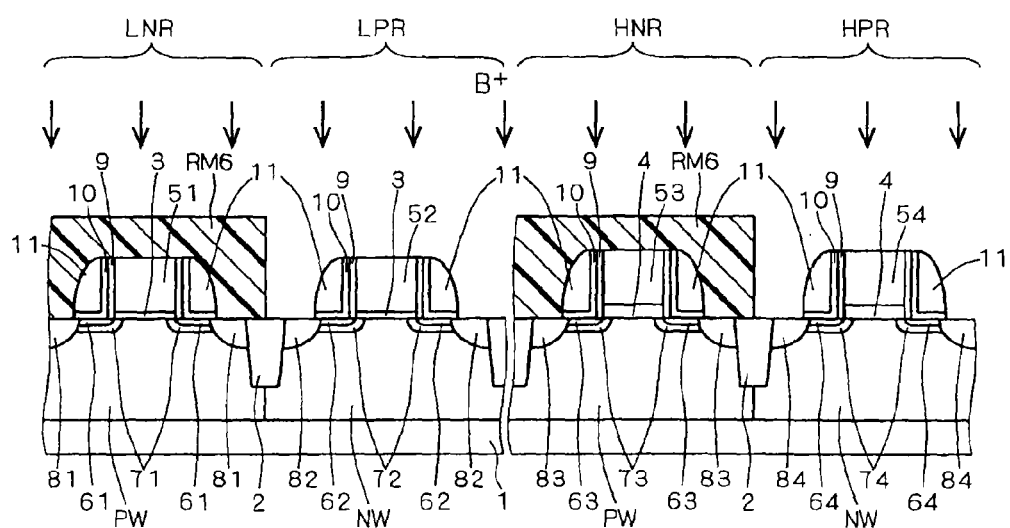

In the step of FIG. 12, a P-type impurity such as boron is ion implanted to a relatively high concentration into the surface of the silicon substrate 1 in the low-voltage PMOS region LPR and a high-voltage PMOS region HPR, thereby to form a pair of source/drain layers 82 and a pair of source/drain layers 84, respectively (source/drain implantation).

The ion implant conditions for boron are an implant energy of 1 to 10 keV and a dose of $1 \times 10^{15}$ to $5 \times 10^{16}$ cm$^{-2}$. The ion implant conditions for boron difluoride are an implant energy of 5 to 50 keV and a dose of $1 \times 10^{15}$ to $5 \times 10^{16}$ cm$^{-2}$.

After the source/drain implantation, implanted impurity ions are activated by heat treatment. The heat treat conditions employed herein are a heat treatment temperature of 800 to 1100° C. and a heat treatment time (which is defined as the time during which the maximum temperature can be maintained) of 0 to 30 seconds.

FIG. 12 shows that the upper portion other than those of the low-voltage PMOS region LPR and the high-voltage PMOS region HPR is covered with a resist mask RM6 by photolithographic patterning and the source/drain implantation is performed on the low-voltage PMOS region LPR using the gate electrode 52, the offset sidewall 9, the offset sidewall 10 and the sidewall insulating film 11 as implant masks and on the high-voltage PMOS region HPR using the gate electrode 54, the offset sidewall 9, the offset sidewall 10 and the sidewall insulating film 11 as implant masks.

Figure 13:
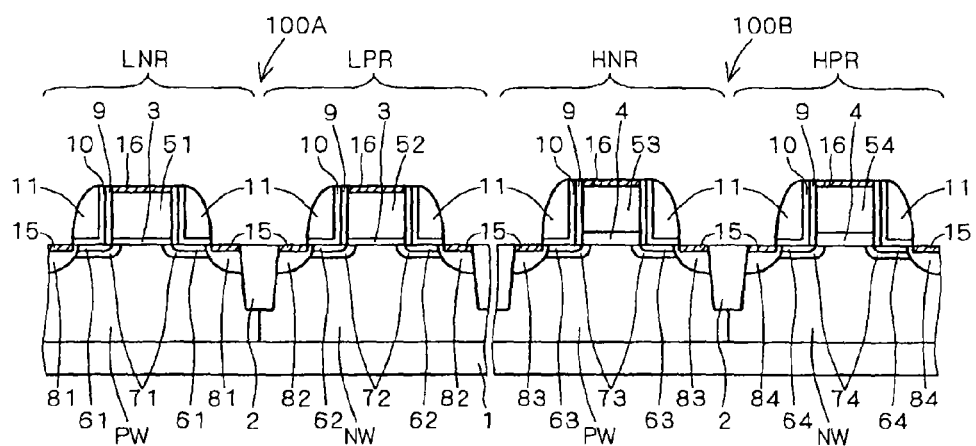

In the step of FIG. 13, a refractory metal film such as cobalt (Co) is formed by sputtering or vapor deposition to cover the whole surface of the silicon substrate 1 and then through high-temperature processing at 350-600° C., silicide films are formed at junctions between the exposed surface of the silicon substrate 1 and the refractory metal film and between the exposed surfaces of the gate electrodes 51 to 54 and the refractory metal film. Then, the unsilicided refractory metal film is removed and cobalt silicide films ($CoSi_2$) 15 and 16 are formed by further heat treatment. This completes the formation of the low-voltage compliant CMOS transistor 100A and the high-voltage compliant CMOS transistor 100B.

<A-2. Function and Effect>

As above described, in the manufacturing method according to the first preferred embodiment, the extension layers 61 of the NMOS transistor in the low-voltage compliant CMOS transistor 100A are formed using the gate electrode 51 and the offset sidewall 9 as implant masks and the extension layers 62 of the PMOS transistor are formed using the gate electrode 52 and the offset sidewalls 9 and 10 as implant masks. Thus, the ion-implanted layers 621 formed for the formation of the extension layers 62 are more spaced from each other and more away from their gate electrode than the ion-implanted layers 611 formed for the formation of the extension layers 61 are. From this, even if implanted impurity ions are diffused by a subsequent heat treatment process, the gate overlap length of the extension layers 62 can be prevented from being longer than that of the extension layers 61.

Such a configuration can prevent the PMOS transistor from having a more prominent short channel effect and can also prevent a reduction in the operating speed of circuits due to an increase in gate-drain parasitic capacitance. It can also prevent an increase in gate-drain current leakage, thereby inhibiting an increase in standby power consumption.

Since the extension layers 61 are formed using the gate electrode 51 and the offset sidewall 9 as implant masks, the ion-implanted layers 611 formed for the formation of the extension layers 61 are formed close to the gate electrode 51. This eliminates the occurrence of a problem that no overlaps exist because of the extension layers 61 not extending under the gate and thus isolation is established between the channel and the source/drain of the NMOS transistor, thereby causing a reduction in operating current.

According to this preferred embodiment, although the low-voltage CMOS transistor 100A is formed such that the spacing between the ion-implanted layers 621 formed for the formation of the extension layers 62 becomes greater than that between the ion-implanted layers 611 formed for the formation of the extension layers 61, the high-voltage compliant CMOS transistor 100B is formed by a conventional technique. This is because it is important for CMOS transistors in the high-voltage circuit portion to maintain hot carrier resistance than reducing a short channel effect. That is, a trade-off exists between the reduction of the short channel effect and the maintenance of the hot carrier resistance; therefore, the high-voltage circuit portion sacrifices the reduction of the short channel effect for maintaining the hot carrier resistance.

B. Second Preferred Embodiment

<B-1. Manufacturing Method>

As one example of a method of manufacturing a semiconductor device according to a second preferred embodiment of the present invention, a method of manufacturing a semiconductor device with CMOS transistors 200A and 200B will be described with reference to FIGS. 14 to 28 which are cross-sectional views illustrating the manufacturing process step by step. The CMOS transistor 200A is low-voltage compliant and the CMOS transistor 200B is high-voltage compliant, their respective structures being illustrated in the final step of FIG. 28. In the following description, like components to those described in the first preferred embodiment with reference to FIGS. 1 to 13 are denoted by the same reference numerals or characters and will not be described herein to avoid overlaps.

Figure 14:
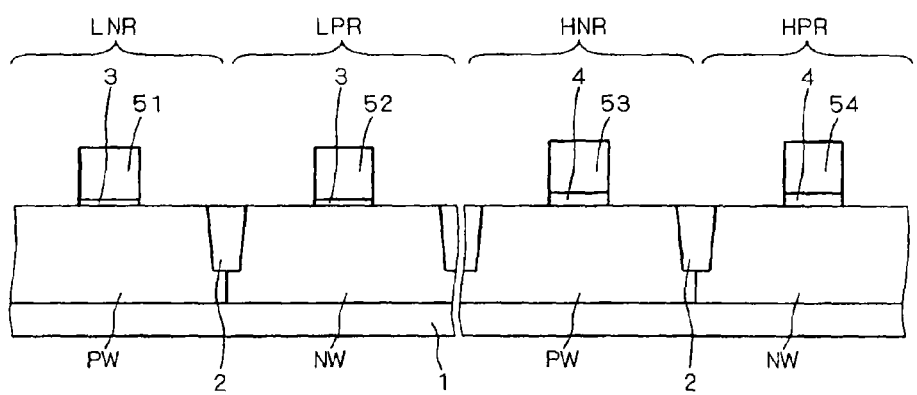

First, as shown in FIG. 14, through the step of FIG. 1, the gate electrodes 51 and 52 are formed on the selectively formed gate insulating films 3 in the low-voltage NMOS region LNR and low-voltage PMOS region LPR, respectively, and the gate electrodes 53 and 54 are formed on the selectively formed gate insulating films 4 in the high-voltage NMOS region HNR and the high-voltage PMOS region HPR, respectively.

Figure 15:
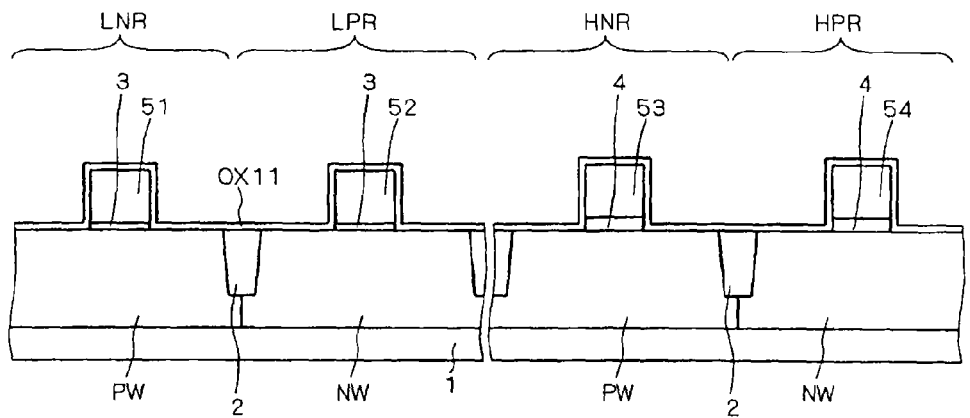
Figure 16:
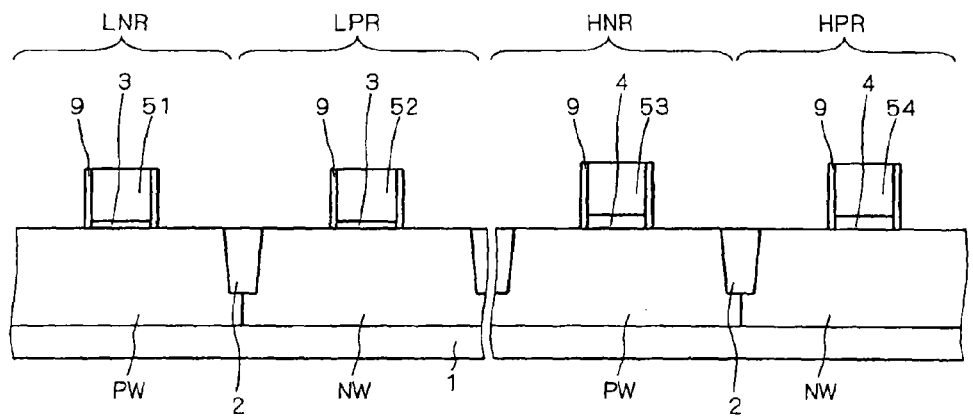

In the step of FIG. 15, a silicon oxide film OX11 is formed to cover the whole surface of the silicon substrate 1. The silicon oxide film OX11 has a thickness of 5 to 30 nm. In the step of FIG. 16, the silicon oxide film OX11 is wholly etched back by anisotropic etching so as to leave the silicon oxide film OX11 only on the side surfaces of the gate electrodes 51 to 54 to form the offset sidewalls 9 thereon. After the formation of the offset sidewalls 9, the silicon substrate 1 may be restored by selective epitaxial growth as described in the first preferred embodiment.

In the step of FIG. 17, an N-type impurity such as arsenic is ion implanted to a relatively low concentration into the surface of the silicon substrate 1 in the high-voltage NMOS region HNR, thereby to form the pair of N-type impurity layers 631 (extension implantation).

The ion implant conditions for arsenic are an implant energy of 10 to 50 keV and a dose of $5 \times 10^{12}$ to $1 \times 10^{14}$ cm$^{-2}$. The ion implant conditions for phosphorous are an implant energy of 10 to 30 keV and a dose of $5 \times 10^{12}$ to $1 \times 10^{14}$ cm$^{-2}$. Alternatively, implantation may be performed with a mixture of those ions.

Then, a P-type impurity such as boron is ion implanted into the silicon substrate 1 to form the pair of P-type impurity layers 731 (pocket implantation). The ion implant conditions at this time are an implant energy of 3 to 15 keV and a dose of $1 \times 10^{12}$ to $1 \times 10^{13}$ cm$^{-2}$. In the pocket implantation, it is desirable, as described in the first preferred embodiment, that the silicon substrate 1 be inclined at a predetermined angle relative to the axis of implantation and rotated intermittently. Further, the pocket implantation is not an absolute necessity.

FIG. 17 shows that the upper portion other than that of the high-voltage NMOS region HNR is covered with a resist mask RM11 by photolithographic patterning and the extension and pocket implantations are performed on the high-voltage NMOS region HNR with the gate electrode 53 and the offset sidewall 9 as implant masks.

The pair of N-type impurity layers 631 and the pair of P-type impurity layers 731 grow into the pair of extension layers 63 and the pair of pocket layers 73 respectively through heat treatment. The pair of extension layers 63 are opposed to each other with the silicon substrate 1 under the gate electrode 53 sandwiched in between. In this case, an area of the silicon substrate 1 under the gate electrode 53 forms a channel region. The pair of extension layers 63 and the pair of pocket layers 73 are shown in FIG. 18 and the following figures.

In the step of FIG. 18, a P-type impurity such as boron is ion implanted to a relatively low concentration into the surface of the silicon substrate 1 in the high-voltage PMOS region HPR, thereby to form the pair of P-type impurity layers 641.

The ion implant conditions for boron are an implant energy of 3 to 20 keV and a dose of $5 \times 10^{12}$ to $1 \times 10^{14}$ cm$^{-2}$. The ion implant conditions for boron difluoride are an implant energy of 15 to 100 keV and a dose of $5 \times 10^{12}$ to $1 \times 10^{14}$ cm$^{-2}$.

Then, an N-type impurity such as arsenic is ion implanted into the silicon substrate 1 to form the pair of N-type impurity layers 741. The ion implant conditions for arsenic are an implant energy of 40 to 140 keV and a dose of $1 \times 10^{12}$ to $1 \times 10^{13}$ cm$^{-2}$. The ion implant conditions for phosphorous are an implant energy of 20 to 70 keV and a dose of $1 \times 10^{12}$ to $1 \times 10^{13}$ cm$^{-2}$. Alternatively, implantation may be performed with a mixture of those ions. In the pocket implantation, it is desirable, as described in the first preferred embodiment, that the silicon substrate 1 be inclined at a predetermined angle relative to the axis of implantation and rotated intermittently.

FIG. 18 shows that the upper portion other than that of the high-voltage PMOS region HPR is covered with a resist mask RM12 by photolithographic patterning and the extension and pocket implantations are performed on the high-voltage PMOS region HPR with the gate electrode 54 and the offset sidewall 9 as implant masks.

The pair of P-type impurity layers 641 and the pair of N-type impurity layers 741 grow into a pair of extension layers 64 and the pair of pocket layers 74 respectively through heat treatment. The pair of extension layers 64 are opposed to each other with the silicon substrate 1 under the gate electrode 54 sandwiched in between. In this case, an area of the silicon substrate 1 under the gate electrode 54 forms a channel region. The pair of extension layers 64 and the pair of pocket layers 74 are shown in FIG. 19 and the following figures.

Figure 19:
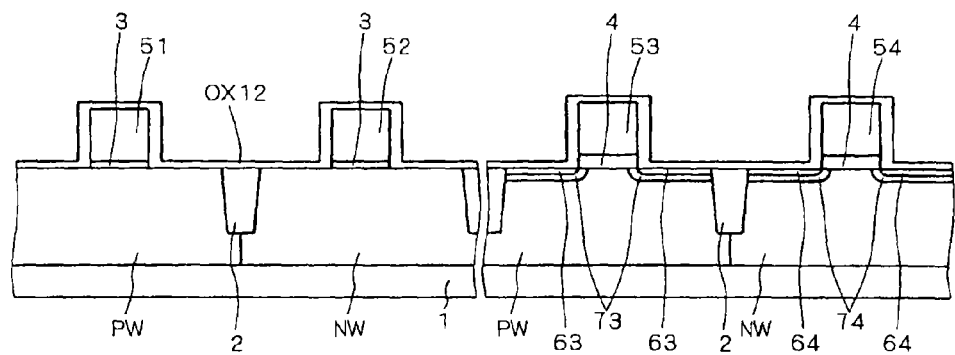

In the step of FIG. 19, a silicon oxide film OX12 is formed to cover the whole surface of the silicon substrate 1. The silicon oxide film OX12 has a thickness of 5 to 30 nm. The offset sidewalls 9 are integrated with the silicon oxide film OX12, so that portions of the silicon oxide film OX12 on the offset sidewalls 9 are greater in thickness than the other portions.

Figure 20:
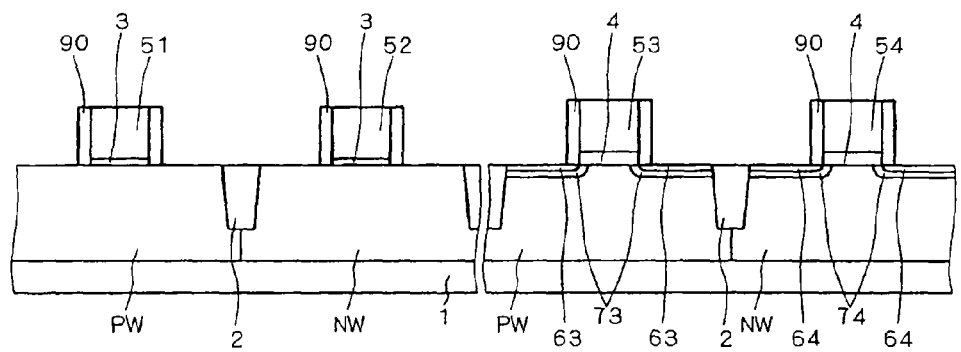

Then, in the step of FIG. 20, the silicon oxide film OX12 is wholly etched back by anisotropic etching so as to leave the silicon oxide film OX12 only on the side surfaces of the gate electrodes 51 to 54 to form offset sidewalls 90 thereon.

Figure 21:
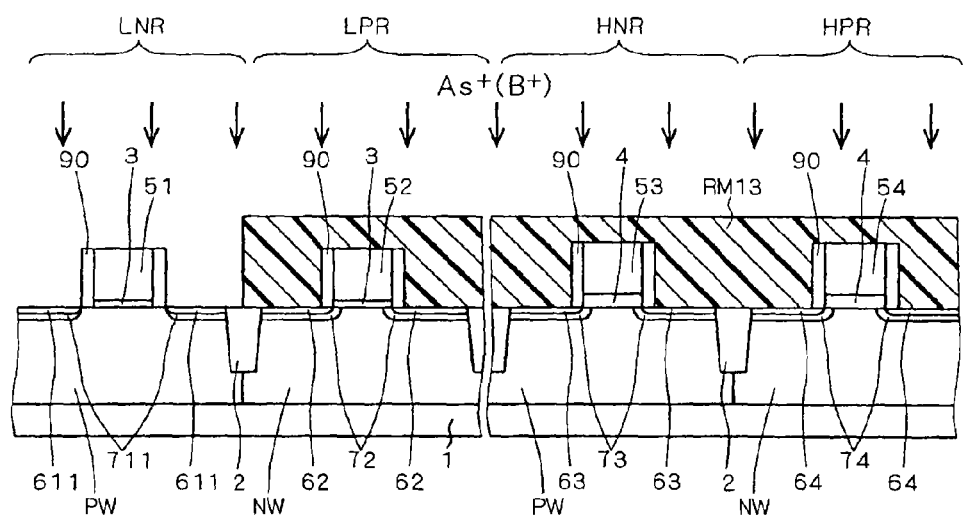

In the step of FIG. 21, an N-type impurity such as arsenic is ion implanted to a relatively low concentration into the surface of the silicon substrate 1 in the low-voltage NMOS region LNR, thereby to form the pair of N-type impurity layers 611.

The ion implant conditions for arsenic are an implant energy of 0.1 to 10 keV and a dose of $2 \times 10^{14}$ to $5 \times 10^{15}$ cm$^{-2}$.

Then, a P-type impurity such as boron is ion implanted into the silicon substrate 1 to form the pair of P-type impurity layers 711. The ion implant conditions at this time are an implant energy of 3 to 15 keV and a dose of $1 \times 10^{13}$ to $5 \times 10^{13}$ cm$^{-2}$. In the pocket implantation, it is desirable, as previously described, that the silicon substrate 1 be inclined at a predetermined angle relative to the axis of implantation and rotated intermittently.

FIG. 21 shows that the upper portion other than that of the low-voltage NMOS region LNR is covered with a resist mask RM13 by photolithographic patterning and the extension and pocket implantations are performed on the low-voltage NMOS region LNR with the gate electrode 51 and the offset sidewall 90 as implant masks.

The pair of N-type impurity layers 611 and the pair of P-type impurity layers 711 grow into the pair of extension layers 61 and the pair of pocket layers 71 respectively through heat treatment. The pair of extension layers 61 are opposed to each other with the silicon substrate 1 under the gate electrode 51 sandwiched in between. In this case, an area of the silicon substrate 1 under the gate electrode 51 forms a channel region. The pair of extension layers 61 and the pair of pocket layers 71 are shown in FIG. 22 and the following figures.

Figure 22:
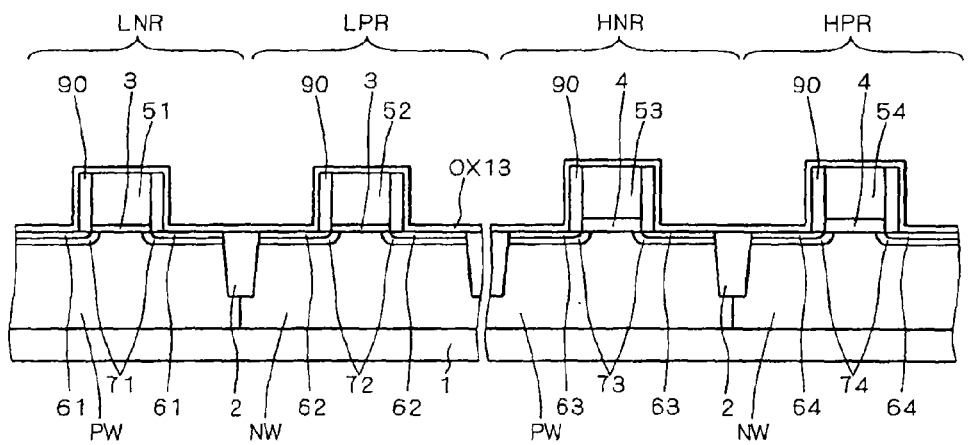

In the step of FIG. 22, a silicon oxide film OX13 is formed to cover the whole surface of the silicon substrate 1. The silicon oxide film OX13 has a thickness of 5 to 30 nm. It acts as an offset sidewall on the side surfaces of the gate electrodes 51 to 54 and in a later step, unnecessary parts thereof are removed to form the offset sidewalls 10. Alternatively, the silicon oxide film OX13 may be etched back at this step so that it remains only on the side surfaces of the gate electrodes and the gate insulating film.

In the step of FIG. 23, a P-type impurity such as boron is ion implanted to a relatively low concentration into the surface of the silicon substrate 1 in the low-voltage PMOS region LPR, thereby to form the pair of P-type impurity layers 621.

The ion implant conditions for boron are an implant energy of 0.1 to 5 keV and a dose of $1 \times 10^{14}$ to $5 \times 10^{15}$ cm$^{-2}$. When the extension implantation is performed without removing the silicon oxide film OX13 formed on the surface of the silicon substrate 1, some of implanted boron ions will stay within the silicon oxide film OX13. Such boron ions in the silicon oxide film OX13, however, will be diffused into the silicon substrate 1 by a subsequent heat treatment process and then will join the extension layers 62.

Then, an N-type impurity such as arsenic is ion implanted into the silicon substrate 1 to form the pair of N-type impurity layers 721. The ion implant conditions at this time are an implant energy of 30 to 120 keV and a dose of $1 \times 10^{13}$ to $5 \times 10^{13}$ cm$^{-2}$. In the pocket implantation, it is desirable, as previously described, that the silicon substrate 1 be inclined at a predetermined angle relative to the axis of implantation and rotated intermittently.

FIG. 23 shows that the upper portion other than that of the low-voltage PMOS region LPR is covered with a resist mask RM14 by photolithographic patterning and the extension and pocket implantations are performed on the low-voltage PMOS region LPR with the gate electrode 52, the offset sidewall 90 and the silicon oxide film OX13 on the side surface of the gate electrode 52 as implant masks.

The pair of P-type impurity layers 621 and the pair of N-type impurity layers 721 grow into the pair of extension layers 62 and a pair of pocket layers 72 respectively through heat treatment. The pair of extension layers 62 are opposed to each other with the silicon substrate 1 under the gate electrode 52 sandwiched in between. In this case, an area of the silicon substrate 1 under the gate electrode 52 forms a channel region. The pair of extension layers 62 and the pair of pocket layers 72 are shown in FIG. 24 and the following figures.

In the step of FIG. 24, the silicon nitride film SN1 is formed to cover the whole surface of the silicon substrate 1. The silicon nitride film SN1 has a thickness of 30 to 100 nm.

Figure 25:
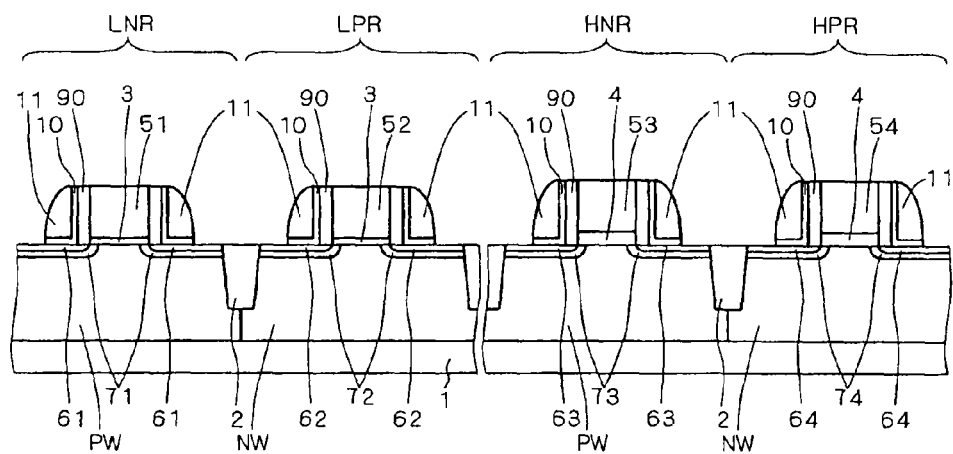

In the step of FIG. 25, the silicon nitride film SN1 is wholly etched back by anisotropic etching so as to leave the silicon nitride film SN1 on the side surfaces of the gate electrodes 51 to 54, more specifically, on the side surfaces of the offset sidewalls 10 on the side surfaces of the gate electrodes 51 to 54, thereby to form the sidewall insulating films 11.

The offset sidewalls 10 are obtained by, after the etch back of the silicon nitride film SN1, removing the silicon oxide film OX13 formed on the gate electrodes 51 to 54 and on the silicon substrate 1.

Figure 26:
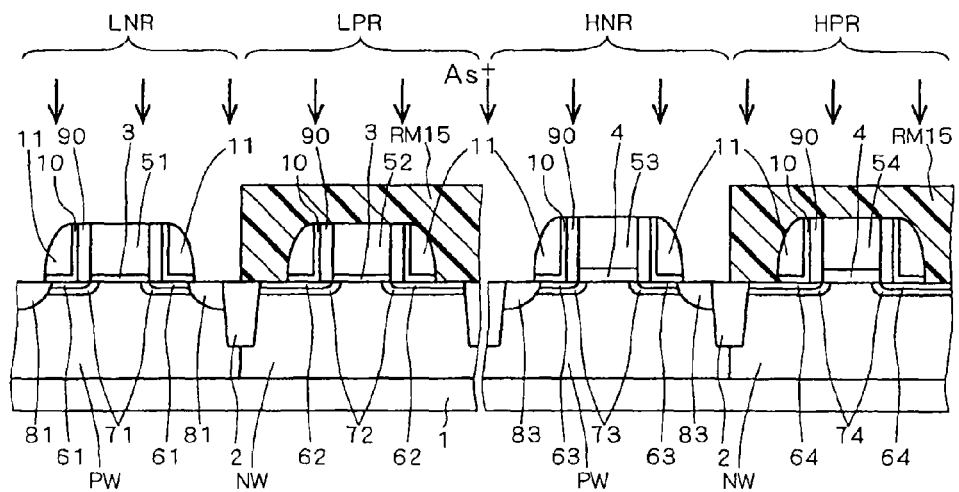

In the step of FIG. 26, an N-type impurity such as arsenic is ion implanted to a relatively high concentration into the surface of the silicon substrate 1 in the low-voltage NMOS region LNR and the high-voltage NMOS region HNR, thereby to form the pair of source/drain layers 81 and the pair of source/drain layers 83, respectively (source/drain implantation).

The ion implant conditions for arsenic are an implant energy of 10 to 100 keV and a dose of $1 \times 10^{15}$ to $5 \times 10^{16}$ cm$^{-2}$.

After the source/drain implantation, implanted impurity ions are activated by heat treatment. The heat treat conditions employed herein are a heat treatment temperature of 800 to 1100° C. and a heat treatment time (which is defined as the time during which the maximum temperature can be maintained) of 0 to 30 seconds.

FIG. 26 shows that the upper portion other than those of the low-voltage NMOS region LNR and the high-voltage NMOS region HNR is covered with a resist mask RM15 by photolithographic patterning and the source/drain implantation is performed on the low-voltage NMOS region LNR using the gate electrode 51, the offset sidewalls 90 and 10, and the sidewall insulating film 11 as implant masks and on the high-voltage NMOS region HNR using the gate electrode 53, the offset sidewalls 90 and 10, and the sidewall insulating film 11 as implant masks.

Figure 27:
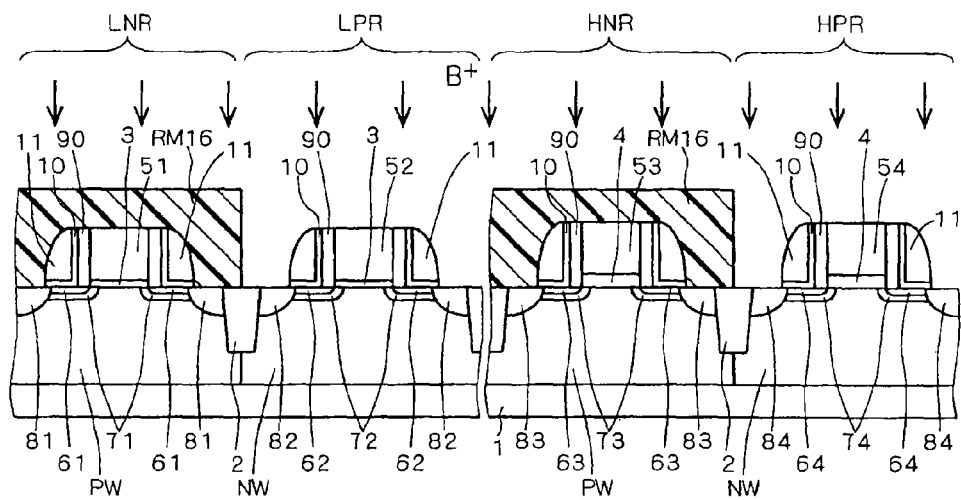

In the step of FIG. 27, a P-type impurity such as boron is ion implanted to a relatively high concentration into the surface of the silicon substrate 1 in the low-voltage PMOS region LPR and the high-voltage PMOS region HPR, thereby to form the pair of source/drain layers 82 and the pair of source/drain layers 84, respectively (source/drain implantation).

The ion implant conditions for boron are an implant energy of 1 to 10 keV and a dose of $1 \times 10^{15}$ to $5 \times 10^{16}$ cm$^{-2}$. The ion implant conditions for boron difluoride are an implant energy of 5 to 50 keV and a dose of $1 \times 10^{15}$ to $5 \times 10^{16}$ cm$^{-2}$.

After the source/drain implantation, implanted impurity ions are activated by heat treatment. The heat treat conditions employed herein are a heat treatment temperature of 800 to 1100° C. and a heat treatment time (which is defined as the time during which the maximum temperature can be maintained) of 0 to 30 seconds.

FIG. 27 shows that the upper portion other than those of the low-voltage PMOS region LPR and the high-voltage PMOS region HPR is covered with a resist mask RM16 by photolithographic patterning and the source/drain implantation is performed on the low-voltage PMOS region LPR using the gate electrode 52, the offset sidewalls 90 and 10, and the sidewall insulating film 11 as implant masks and on the high-voltage PMOS region HPR using the gate electrode 54, the offset sidewalls 90 and 10, and the sidewall insulating film 11 as implant masks.

Figure 28:
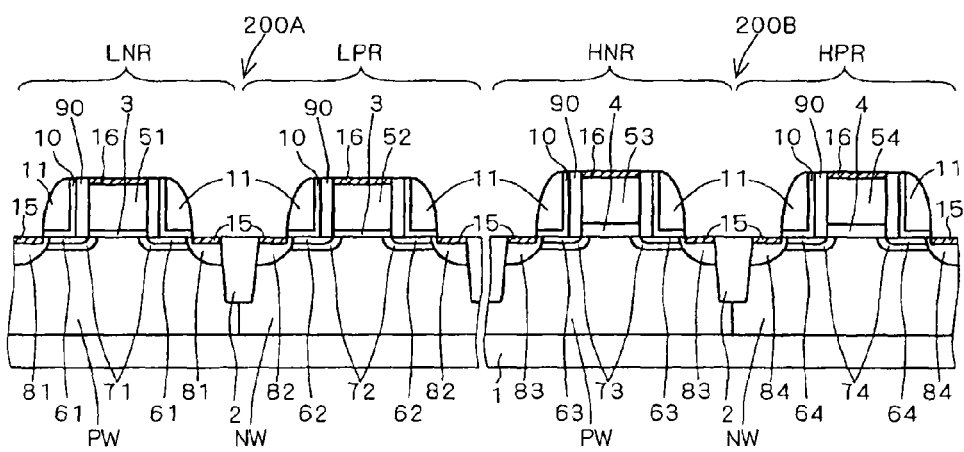

In the step of FIG. 28, a refractory metal film such as cobalt (Co) is formed by sputtering or vapor deposition to cover the whole surface of the silicon substrate 1 and then, through high-temperature processing at 350-600° C., silicide films are formed at junctions between the exposed surface of the silicon substrate 1 and the refractory metal film and between the exposed surfaces of the gate electrodes 51 to 54 and the refractory metal film. Then, the unsilicided refractory metal film is removed and the cobalt silicide films (CoSi$_2$) 15 and 16 are formed by further heat treatment. This completes the formation of the low-voltage compliant CMOS transistor 200A and the high-voltage compliant CMOS transistor 200B.

<B-2. Function and Effect>

As above described, in the manufacturing method according to the second preferred embodiment, the extension layers 61 of the NMOS transistor in the low-voltage compliant CMOS transistor 200A are formed using the gate electrode 51 and the offset sidewall 90 as implant masks and the extension layers 62 of the PMOS transistor are formed using the gate electrode 52 and the offset sidewalls 90 and 10 as implant masks. Thus, the ion-implanted layers 621 formed for the formation of the extension layers 62 are more spaced from each other and more away from their gate electrode than the ion-implanted layers 611 formed for the formation of the extension layers 61 are. From this, even if implanted impurity ions are diffused by a subsequent heat treatment process, the gate over length of the extension layers 62 can be prevented from being longer than that of the extension layers 61.

Such a configuration can prevent the PMOS transistor from having a more prominent short channel effect and can also prevent a reduction in the operating speed of circuits due to an increase in gate-drain parasitic capacitance. It can also prevent an increase in gate-drain current leakage, thereby inhibiting an increase in standby power consumption.

Since the extension layers 61 are formed using the gate electrode 51 and the offset sidewall 90 as implant masks, the ion-implanted layers 611 formed for the formation of the extension layers 61 are formed close to the gate electrode 51. This eliminates the occurrence of a problem that no overlaps exist because of the extension layers 61 not extending under the gate and thus isolation is established between the channel and the source/drain of the NMOS transistor, thereby causing a reduction in operating current.

In the low-voltage compliant CMOS transistor 200B, since the extension layers 64 of the PMOS transistor are formed using the gate electrode 54 and the offset sidewall 90 as implant masks, the ion-implanted layers 641 formed for the formation of the extension layers 64 are more spaced from each other and more away from the gate electrode. Thus, even if implanted impurity ions are diffused by a subsequent heat treatment process, the gate overlap length of the extension layers 64 can be prevented from being longer than required. Accordingly, even a short channel effect of the high-voltage compliant CMOS transistor 200B can be reduced, which improves the balance between the maintenance of the hot carrier resistance and the reduction of the short channel effect.

C. Third Preferred Embodiment

<C-1. Manufacturing Method>

As one example of a method of manufacturing a semiconductor device according to a third preferred embodiment of the present invention, a method of manufacturing a semiconductor device with CMOS transistors 300A and 300B will be described with reference to FIGS. 29 to 33, which are cross-sectional views illustrating the manufacturing process step by step. The CMOS transistor 300A is low-voltage compliant and the CMOS transistor 300B is high-voltage compliant, their respective structures being illustrated in the final step of FIG. 33. In the following description, like components to those described in the first preferred embodiment with reference to FIGS. 1 to 13 are denoted by the same reference numerals or characters and will not be described herein to avoid overlaps.

Figure 29:
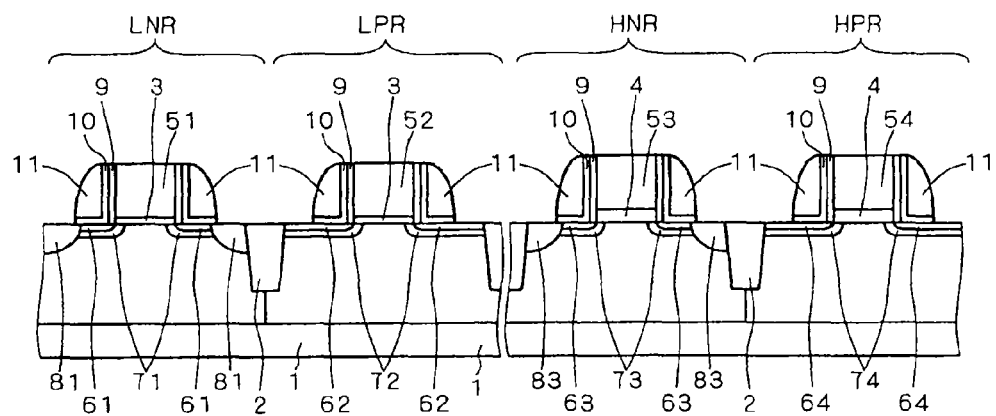
FIGS. 29 to 33 are diagrams illustrating the manufacturing process of a semiconductor device according to a third preferred embodiment of the present invention.

In the third preferred embodiment, as shown in FIG. 29, through the steps of FIGS. 1 to 11, the sidewall insulating films 11 are formed on the side surfaces of the gate electrodes 51 to 54, more specifically, on the side surfaces of the offset sidewalls 10 on the side surfaces of the gate electrodes 51 to 54. Then, the pair of source/drain layers 81 are formed in the low-voltage NMOS region LNR using the gate electrode 51, the offset sidewalls 9 and 10, and the sidewall insulating film 11 as implant masks, and the pair of source/drain layers 83 are formed in the high-voltage NMOS region HNR using the gate electrode 53, the offset sidewalls 9 and 10, and the sidewall insulating film 11 as implant masks.

Figure 30:
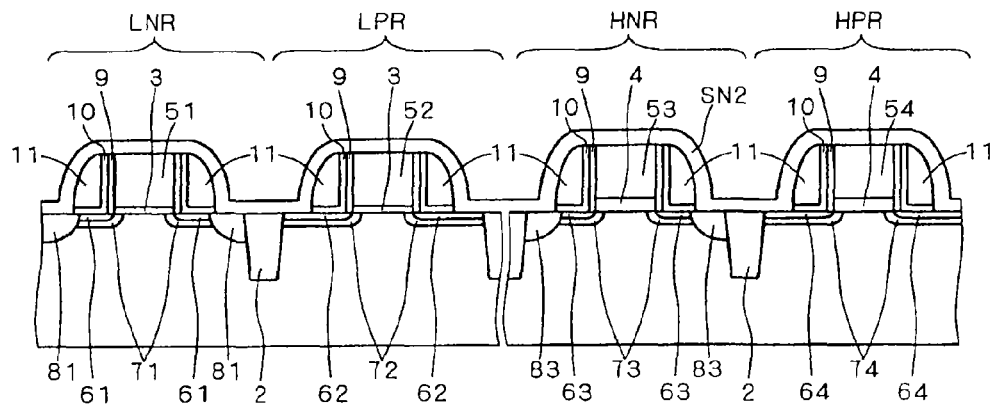

In the step of FIG. 30, a silicon nitride film SN2 is formed to cover the whole surface of the silicon substrate 1. The silicon nitride film SN2 has a thickness of 10 to 50 nm. The silicon nitride film may be replaced by a silicon oxide film or by a multilayer film of silicon oxide film and silicon nitride film.

Figure 31:
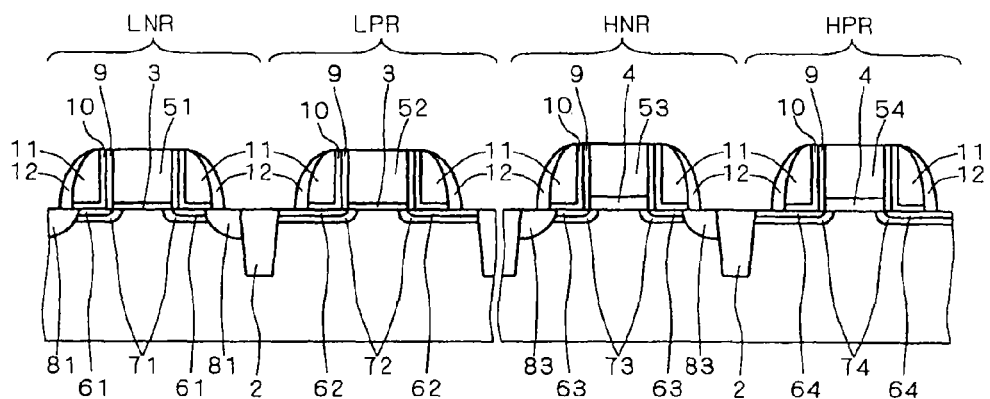

In the step of FIG. 31, the silicon nitride film SN2 is wholly etched back by anisotropic etching thereby to form sidewall insulating films 12 on all the side surfaces of the sidewall insulating films 11.

Figure 32:
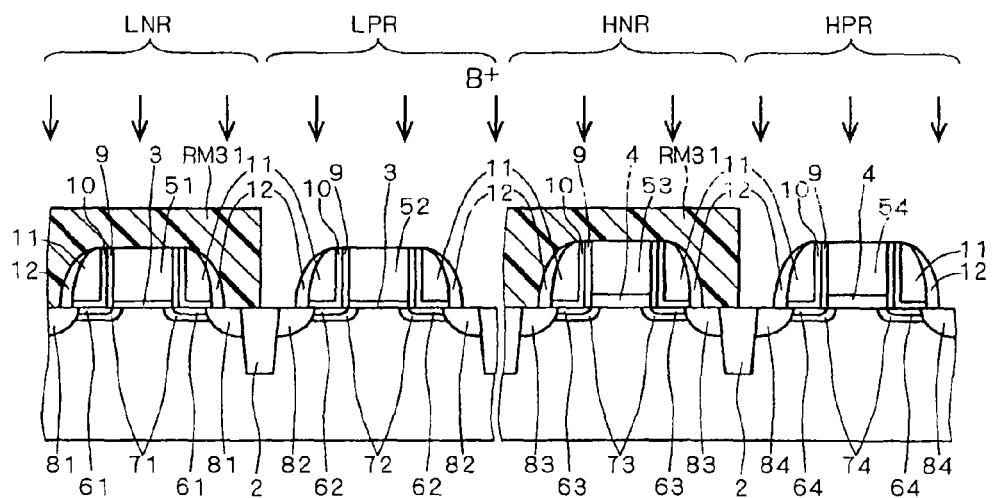

In the step of FIG. 32, a P-type impurity such as boron is ion implanted to a relatively high concentration into the surface of the silicon substrate 1 in the low-voltage PMOS region LPR and the high-voltage PMOS region HPR, thereby to form the pair of source/drain layers 82 and the pair of source/drain layers 84, respectively (source/drain implantation).

The ion implant conditions for boron are an implant energy of 1 to 10 keV and a dose of $1 \times 10^{15}$ to $5 \times 10^{16}$ cm$^{-2}$. The ion implant conditions for boron difluoride are an implant energy of 5 to 50 keV and a dose of $1 \times 10^{15}$ to $5 \times 10^{16}$ cm$^{-2}$.

After the source/drain implantation, implanted impurity ions are activated by heat treatment. The heat treat conditions employed herein are a heat treatment temperature of 800 to 1100° C. and a heat treatment time (which is defined as the time during which the maximum temperature can be maintained) of 0 to 30 seconds.

FIG. 32 shows that the upper portion other than those of the low-voltage PMOS region LPR and the high-voltage PMOS region HPR is covered with a resist mask RM31 by photolithographic patterning and the source/drain implantation is performed on the low-voltage PMOS region LPR using the gate electrode 52, the offset sidewall 9, the offset sidewall 10 and the sidewall insulating films 11 and 12 as implant masks and on the high-voltage PMOS region HPR using the gate electrode 54, the offset sidewall 9, the offset sidewall 10 and the sidewall insulating films 11 and 12 as implant masks.

Figure 33:
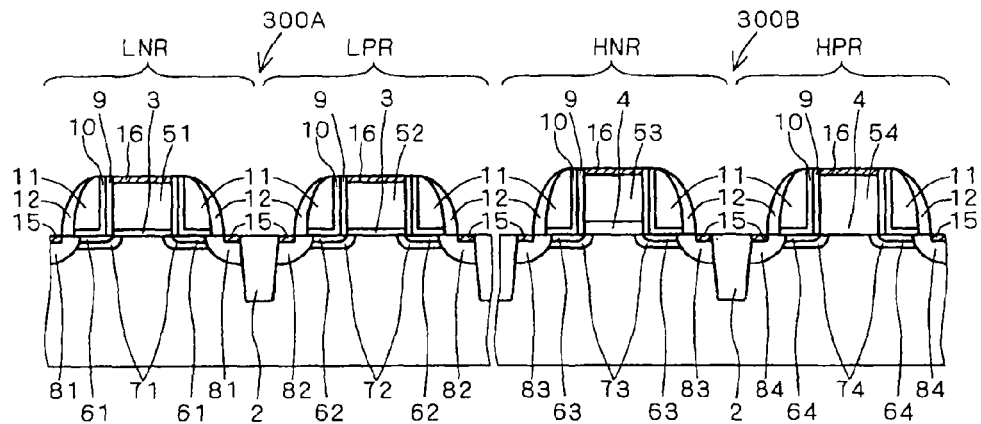
Figure 33:
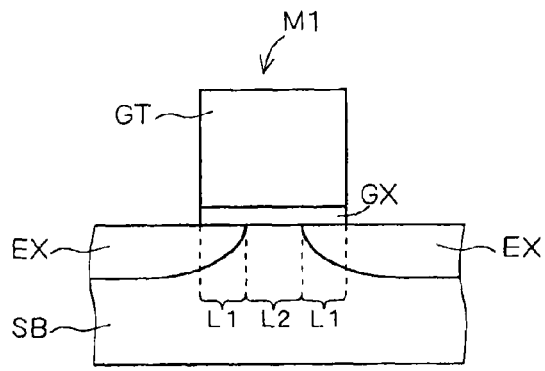
Figure 33:
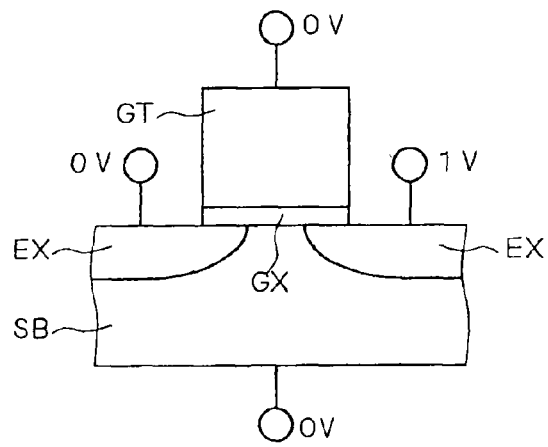

Then, in the step of FIG. 33, a refractory metal film such as cobalt (Co) is formed by sputtering or vapor deposition to cover the whole surface of the silicon substrate 1 and then, through high-temperature processing at 350-600° C., silicide films are formed at junctions between the exposed surface of the silicon substrate 1 and the refractory metal film and between the exposed surfaces of the gate electrodes 51 to 54 and the refractory metal film. Then, the unsilicided refractory metal film is removed and the cobalt silicide films (CoSi$_2$) 15 and 16 are formed by further heat treatment. This completes the formation of the low-voltage compliant CMOS transistor 300A and the high-voltage compliant CMOS transistor 300B.

<C-2. Function and Effect>

As above described, in the manufacturing method according to the third preferred embodiment, the ion-implanted layers 621 formed for the formation of the extension layers 62 in the low-voltage compliant CMOS transistor 300A are more spaced from each other and more away from their gate electrode than the ion-implanted layers 611 formed for the formation of the extension layers 61 are. Thus, even if implanted impurity ions are diffused by a subsequent heat treatment process, the gate overlap length of the extension layers 62 can be prevented from being longer than that of the extension layers 61. Further in the low-voltage compliant CMOS transistor 300A and the high-voltage compliant CMOS transistor 300B, the ion-implanted layers formed for the formation of the source/drain layers 82 and 84 of the PMOS transistors are more spaced from each other and more away from their respective gate electrodes than the ion-implanted layers formed for the formation of the source/drain layers 81 and 83 of the NMOS transistors. Thus, even if implanted impurity ions are diffused by a subsequent heat treatment process, the diffusion of impurity ions from the source/drain layers into the channel regions can be prevented.

Such a configuration can prevent the PMOS transistor from having a more prominent short channel effect and can also prevent a reduction in the operating speed of circuits due to an increase in gate-drain parasitic capacitance. It can also prevent an increase in gate-drain current leakage with reliability, thereby inhibiting an increase in standby power consumption.

Since the extension layers 61 are formed using the gate electrode 51 and the offset sidewall 9 as implant masks, the ion-implanted layers 611 formed for the formation of the extension layers 61 are formed close to the gate electrode 51. This eliminates the occurrence of a problem that no overlaps exist because of the extension layers 61 not extending under the gate and thus isolation is established between the channel and the source/drain of the NMOS transistor, thereby causing a reduction in operating current.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing a semiconductor device including a first n-type MISFET formed in a first region of a semiconductor substrate, a first p-type MISFET formed in a second region of the semiconductor substrate, a second n-type MISFET formed in a third region of the semiconductor substrate and having a thicker gate insulating film than the first n-type MISFET, and a second p-type MISFET formed in a fourth region of the semiconductor substrate and having a thicker gate insulating film than the first p-type MISFET, comprising steps of:
   (a) forming a gate insulating film of the first n-type MISFET over the first region, forming a gate insulating film of the first p-type MISFET over the second region, forming a gate insulating film of the second n-type MISFET over the third region, and forming a gate insulating film of the second p-type MISFET over the fourth region;
   (b) forming a first gate electrode over the gate insulating film of the first n-type MISFET, forming a second gate electrode over the gate insulating film of the first p-type MISFET, forming a third gate electrode over the gate insulating film of the second n-type MISFET, and forming a fourth gate electrode over the gate insulating film of the second p-type MISFET;
   (c) after the step (b), under a condition which a first resist pattern covers the first, second and fourth regions, forming third n-type impurity regions in the third region by ion implantation method;
   (d) after the step (b), under a condition which a second resist pattern covers the first, second and third regions, forming third p-type impurity regions in the fourth region by ion implantation method;
   (e) after the steps (c) and (d), forming first insulating films over side surfaces of the first, second, third and fourth gate electrodes;
   (f) after the step (e), under a condition which a third resist pattern covers the second, third and fourth regions, forming first n-type impurity regions in the first region by ion implantation method;
   (g) after the step (f), forming second insulating films over the side surfaces of the first, second, third and fourth gate electrodes via the first insulating films;
   (h) after the step (g), under a condition which a fourth resist pattern covers the first, third and fourth regions, forming first p-type impurity regions in the second region by ion implantation method;
   (i) after the step (h), forming third insulating films over the side surfaces of the first, second, third and fourth gate electrodes via the first and second insulating films, wherein a thickness of each the third insulating films is thicker than a thickness of each the first and second insulating films;
   (j) after the step, (i), under a condition which a fifth resist pattern covers the second and fourth regions, forming second n-type impurity regions in the first region and forming fourth n-type impurity regions in the third region by ion implantation method, wherein an impurity concentration of each the second n-type impurity regions is higher than an impurity concentration of each the first n-type impurity regions, and wherein an impurity concentration of each the third n-type impurity regions is higher than an impurity concentration of each the fourth n-type impurity regions; and
   (k) after the step (i), under a condition which a sixth resist pattern covers the first and third regions, forming second p-type impurity regions in the second region and forming fourth p-type impurity regions in the fourth region by ion implantation method, wherein an impurity concentration of each the second p-type impurity regions is higher than an impurity concentration of each the first p-type impurity region, and wherein an impurity concentration of each the third p-type impurity regions is higher than an impurity concentration of each the fourth p-type impurity regions.

2. A method of manufacturing a semiconductor device according to claim 1, further comprising a step of forming a p-type pocket region in the first region during the step (f).

3. A method of manufacturing a semiconductor device according to claim 1, further comprising a step of forming an n-type pocket region in the second region during the step (h).

4. A method of manufacturing a semiconductor device according to claim 1, wherein each the first insulating films includes a silicon oxide film.

5. A method of manufacturing a semiconductor device according to claim 1,
   wherein each the second insulating films includes a silicon oxide film.

6. A method of manufacturing a semiconductor device according to claim 1,
   wherein each the third insulating films includes a silicon nitride film.

7. A method of manufacturing a semiconductor device according to claim 1,
   wherein each the third insulating films is a spacer state.

8. A method of manufacturing a semiconductor device according to claim 1, further comprising step of:
   (l) after the step (k), forming silicide films over the top surface of the first, second, third and fourth gate electrodes, over the top surface of the second and fourth n-type impurity regions, and over the top surface of the second and fourth p-type impurity regions.

* * * * *